(12) United States Patent
Nakao et al.

(10) Patent No.: US 10,345,360 B2
(45) Date of Patent: Jul. 9, 2019

(54) CAPACITOR LIFE DIAGNOSIS DEVICE, CAPACITOR LIFE DIAGNOSIS METHOD, AND PROGRAM

(71) Applicant: FUJITSU LIMITED, Kawasaki-shi, Kanagawa (JP)

(72) Inventors: Hiroshi Nakao, Yamato (JP); Yu Yonezawa, Sagamihara (JP); Takahiko Sugawara, Kawasaki (JP); Yoshiyasu Nakashima, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 396 days.

(21) Appl. No.: 15/162,966

(22) Filed: May 24, 2016

(65) Prior Publication Data
US 2016/0356837 A1    Dec. 8, 2016

(30) Foreign Application Priority Data

Jun. 4, 2015   (JP) ................................. 2015-114067
Apr. 7, 2016   (JP) ................................. 2016-077406

(51) Int. Cl.
| | |
|---|---|
| G01R 31/02 | (2006.01) |
| G01R 31/01 | (2006.01) |
| H02M 1/32 | (2007.01) |
| H02M 1/42 | (2007.01) |
| H02M 3/335 | (2006.01) |
| H02M 1/00 | (2006.01) |

(52) U.S. Cl.
CPC ......... *G01R 31/028* (2013.01); *G01R 31/016* (2013.01); *H02M 1/32* (2013.01); *H02M 1/4225* (2013.01); *H02M 3/33523* (2013.01); *H02M 2001/007* (2013.01); *Y02B 70/126* (2013.01)

(58) Field of Classification Search
CPC ............................ G01R 31/028; G01R 31/016
See application file for complete search history.

(56) References Cited

U.S. PATENT DOCUMENTS

| | | | | |
|---|---|---|---|---|
| 2007/0221627 A1* | 9/2007 | Yugou | .................. | H01H 47/002 218/136 |
| 2009/0127342 A1* | 5/2009 | Giebel | ............... | G06K 7/10722 235/462.42 |
| 2012/0113685 A1* | 5/2012 | Inukai | ..................... | H02M 1/36 363/21.01 |

FOREIGN PATENT DOCUMENTS

| | | |
|---|---|---|
| JP | 3-150074 | 6/1991 |
| JP | 2000-308339 | 11/2000 |
| JP | 2011-97683 | 5/2011 |

* cited by examiner

*Primary Examiner* — Alesa Allgood
(74) *Attorney, Agent, or Firm* — Staas & Halsey LLP

(57) ABSTRACT

A capacitor life diagnosis device includes: a first fluctuation detecting unit configured to detect a maximum value of fluctuation in output voltage of a first capacitor every fixed time; and an output unit configured to predict a residual life of the first capacitor on the basis of temporal transition of the maximum value of fluctuation in the output voltage detected by the first fluctuation detecting unit, and output a signal indicating the residual life of the first capacitor.

12 Claims, 13 Drawing Sheets

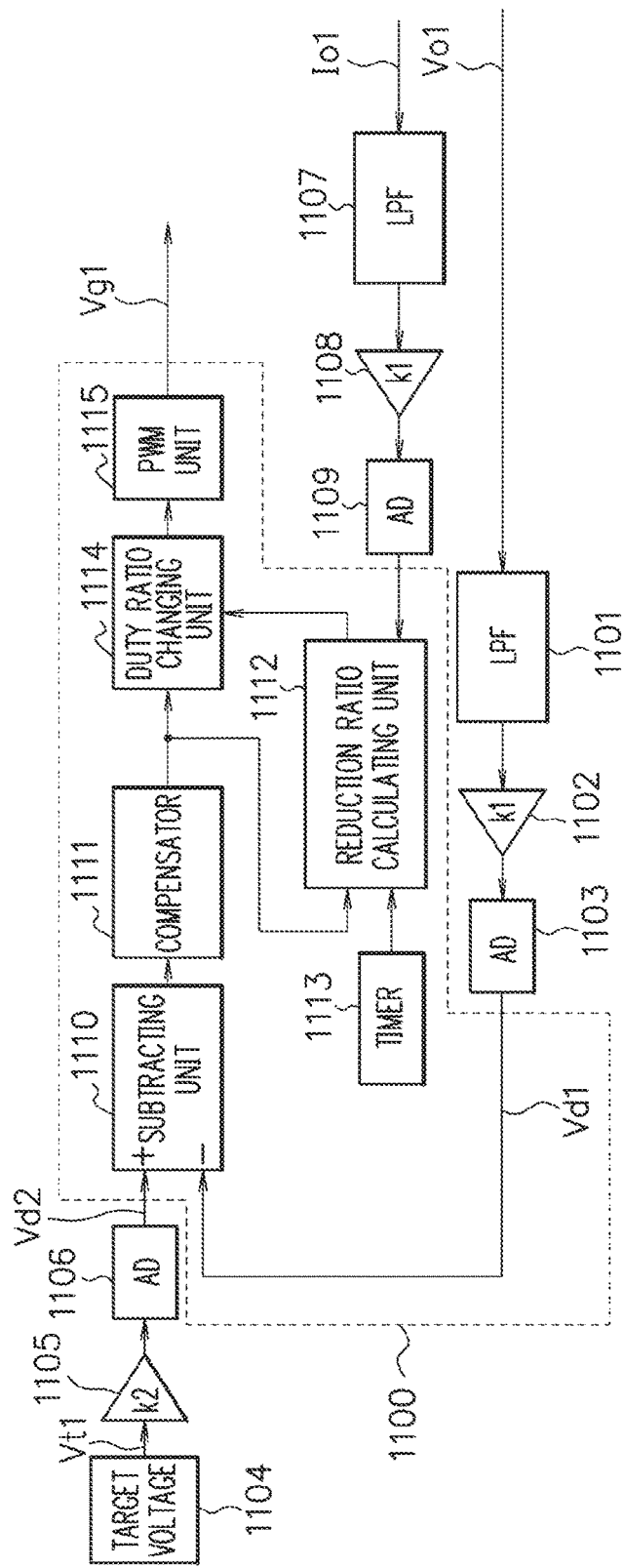
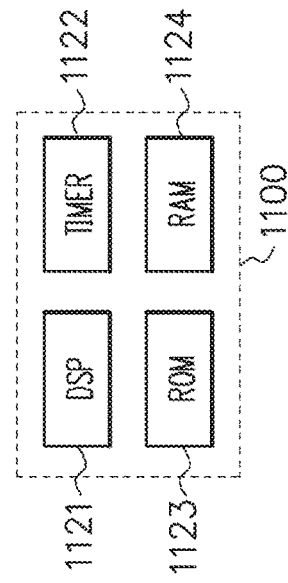
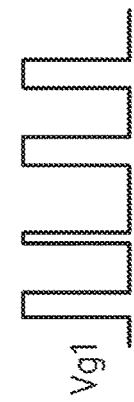
FIG. 11A
FIG. 11C
FIG. 11B

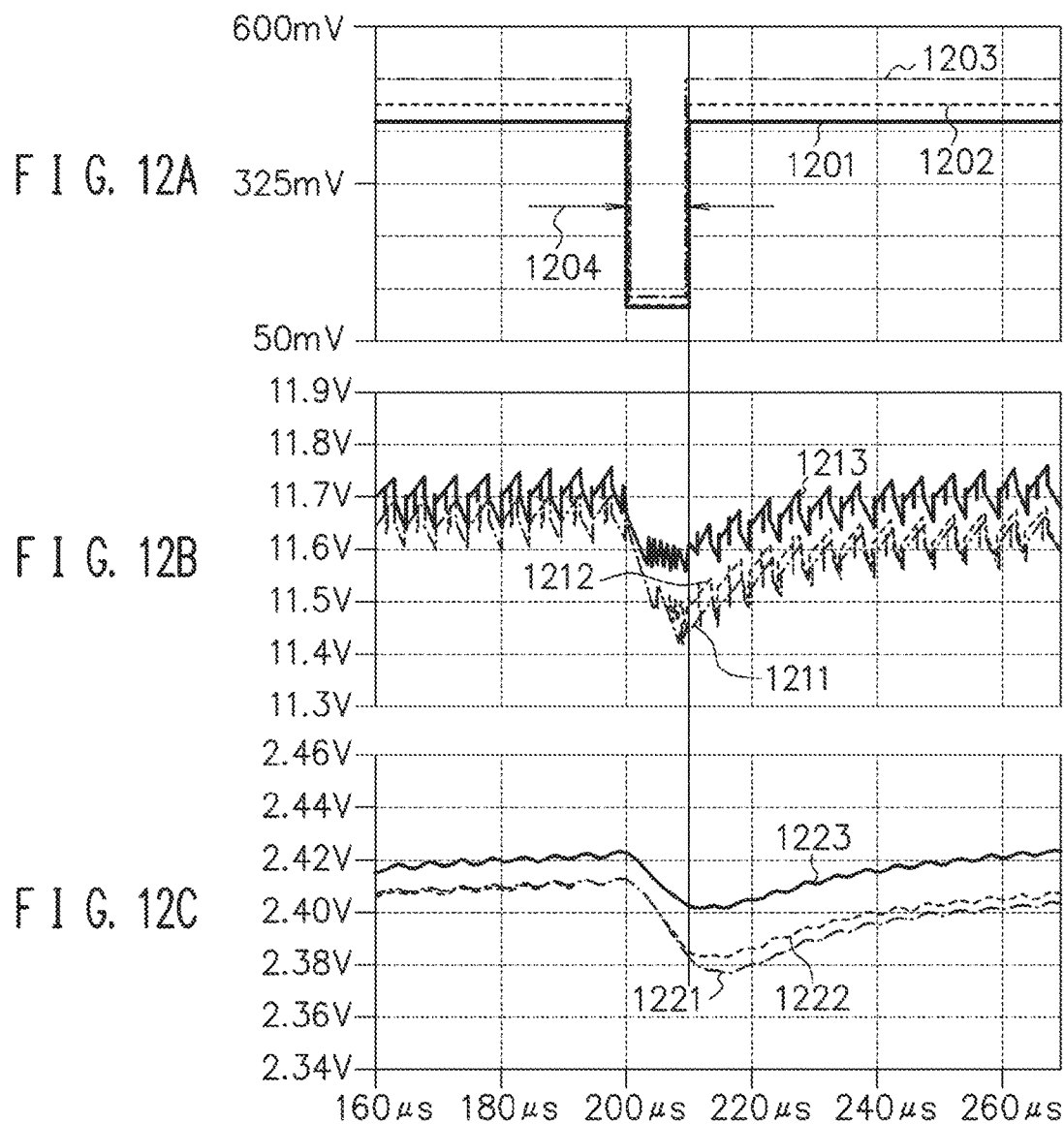

F I G. 13A
F I G. 13B
F I G. 13C
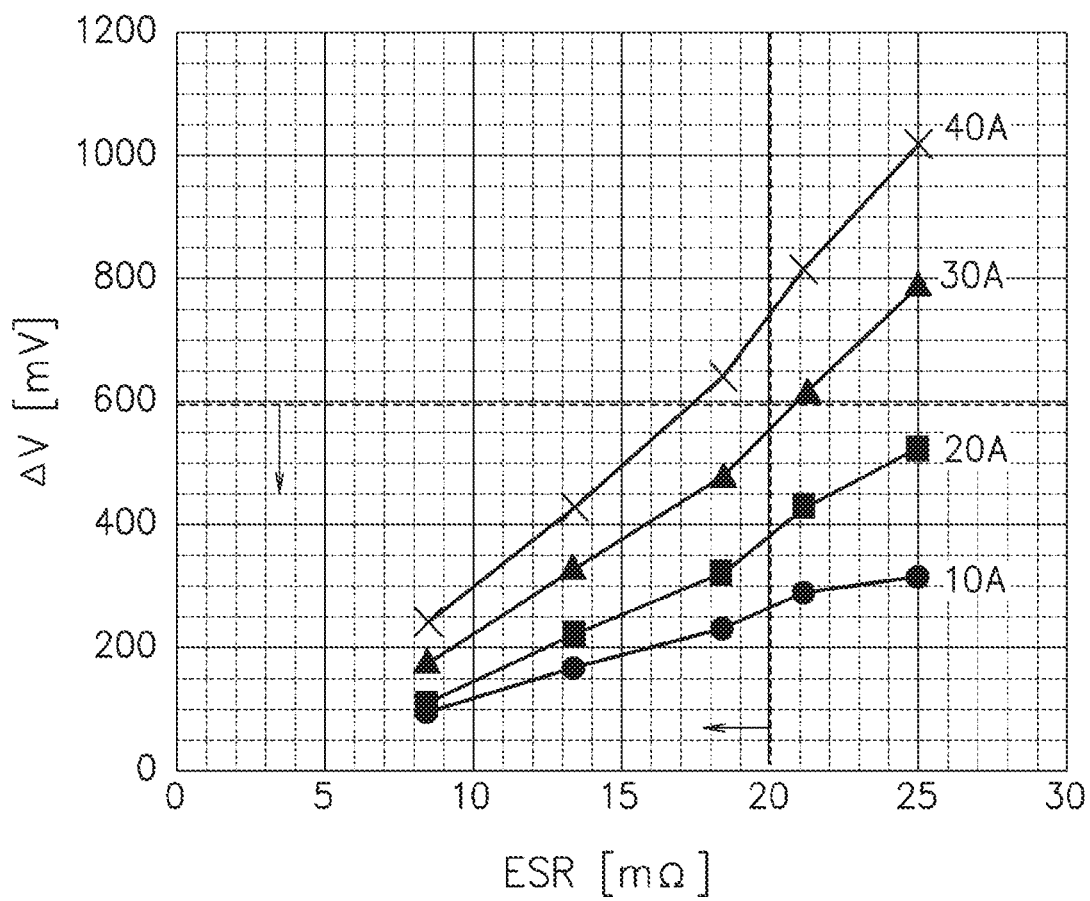

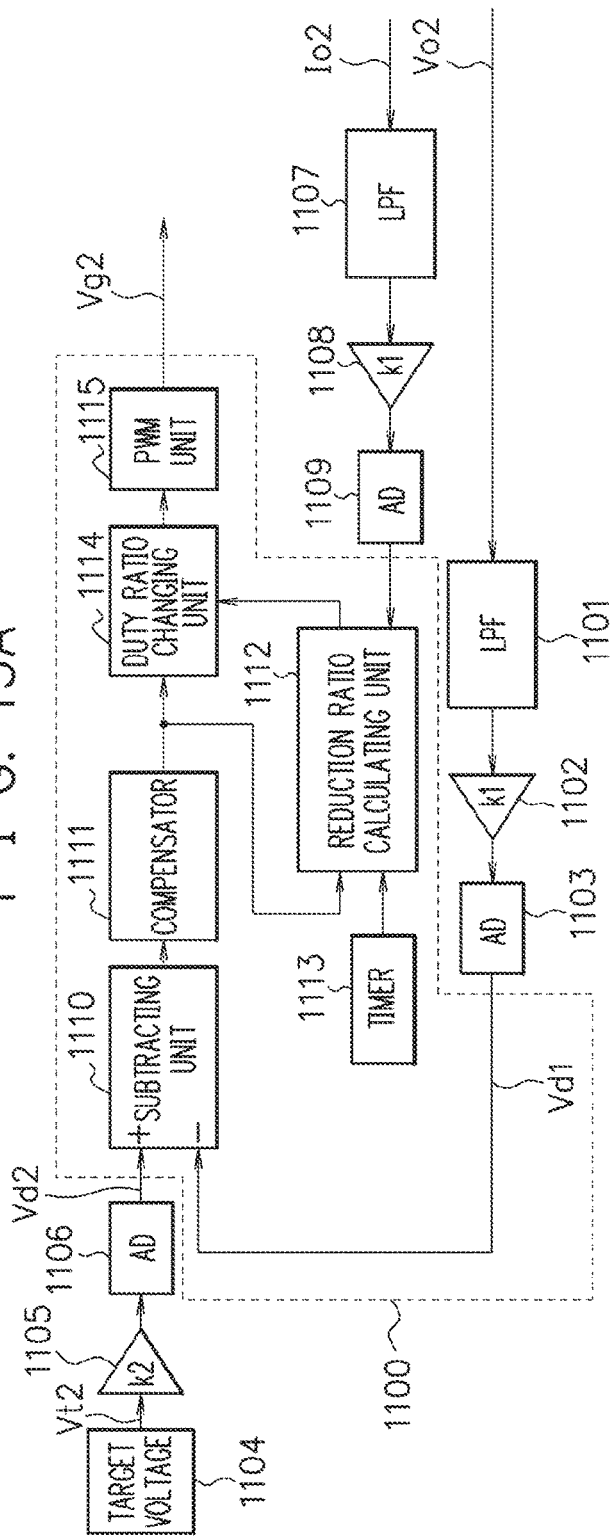
F I G. 15A
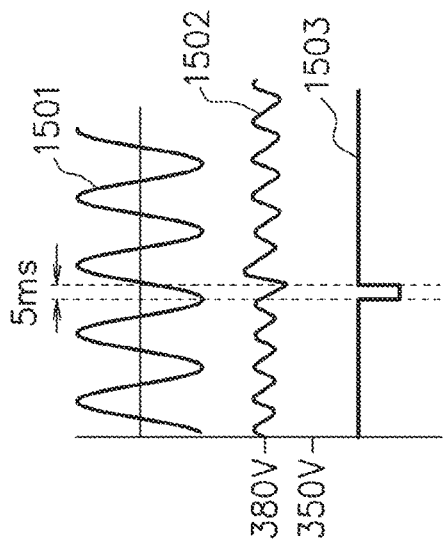
F I G. 15B

000
CAPACITOR LIFE DIAGNOSIS DEVICE, CAPACITOR LIFE DIAGNOSIS METHOD, AND PROGRAM

CROSS-REFERENCE TO RELATED APPLICATIONS

This application is based upon and claims the benefit of priority of the prior Japanese Patent Application No. 2016-077406, filed on Apr. 7, 2016, and the Japanese Patent Application No. 2015-114067, filed on Jun. 4, 2015, the entire contents of which are incorporated herein by reference.

FIELD

The embodiments discussed herein are directed to a capacitor life diagnosis device, a capacitor life diagnosis method, and a program.

BACKGROUND

There is a known capacitor life determining device which is connected to a DC-DC converter and a load circuit and determines whether or not an output capacitor of the DC-DC converter is at the end of life (refer to Patent Document 1). The DC-DC converter has the output capacitor than is charged by a direct-current power supply, a switching element that turns on/off the charge from the direct-current power supply to the output capacitor, and a control unit. The control unit periodically drives on/off of the switching element, detects a voltage between both ends of the output capacitor, and decides the on-duty of the switching element by feedback control of bringing the voltage between both ends of the output capacitor to a predetermined target voltage. The load circuit is a load circuit that converts output power of the DC-DC converter and outputs it to the load, and varies the output power to the load according to an input from the outside. The capacitor life determining device includes a load control unit, a voltage detecting unit, and a life determining unit. The load control unit periodically performs determination control of temporarily changing the output power of the load circuit, at an interval longer than the duration of the determination control. The voltage detecting unit detects at least an alternating-current component of the voltage between both ends of the output capacitor immediately after the determination control is started. The life determining unit determines whether or not the output capacitor is at the end of life, on the basis of the amplitude of the voltage between both ends detected by the voltage detecting unit.

There also is a known switching power supply device that generates a direct-current voltage by rectifying and smoothing an alternating-current input and generates an output voltage by switching, transforming, and rectifying and smoothing the direct-current voltage, and has an electrolytic capacitor for smoothing processing (refer to Patent Document 2). The switching power supply device has a process of measuring the frequency of the alternating-current input, a process of measuring the output voltage and the output current, and a process of measuring the voltage between both ends of the electrolytic capacitor. The switching power supply device further has a process of converting, on the basis of the measured frequency, output voltage and output current and a terminal voltage of the electrolytic capacitor, the terminal voltage into a terminal voltage at the time when applying a rated load. Further, the switching power supply device has a process of comparing the converted terminal voltage with a predetermined initial value of the terminal voltage to determine a decrease in electrostatic capacitance of the electrolytic capacitor.

Patent Document 1: Japanese Laid-open Patent Publication No. 2011-97683
Patent Document 2: Japanese Laid-open Patent Publication No. 2000-308339

Patent Document 1 is intended to determine whether or not the output capacitor is at the end of life at the present moment. Besides, Patent Document 2 is intended to determine the decrease in electrostatic capacitance of the electrolytic capacitor. However, Patent Documents 1 and 2 cannot report the residual life of the capacitor.

SUMMARY

A capacitor life diagnosis device includes: a first fluctuation detecting unit configured to detect a maximum value of fluctuation in output voltage of a first capacitor every fixed time; and an output unit configured to predict a residual life of the first capacitor on the basis of temporal transition of the maximum value of fluctuation in the output voltage detected by the first fluctuation detecting unit, and output a signal indicating the residual life of the first capacitor.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 11A to FIG. 11C are diagrams and a chart for explaining a control unit according to a fifth embodiment;
FIG. 12A is a chart illustrating voltages corresponding to a duty ratio,
FIG. 12B is a chart illustrating waveforms of output voltages of the electrolytic capacitor,
and FIG. 12C is a chart illustrating waveforms of voltages outputted from a low-pass filter;
FIG. 13A to FIG. 13C are diagrams and a chart for explaining a method of deciding a reduction ratio;

FIG. 15A and FIG. 15B are a diagram and a chart for explaining a control unit according to a sixth embodiment.

DESCRIPTION OF EMBODIMENTS

First Embodiment

Figure 1:
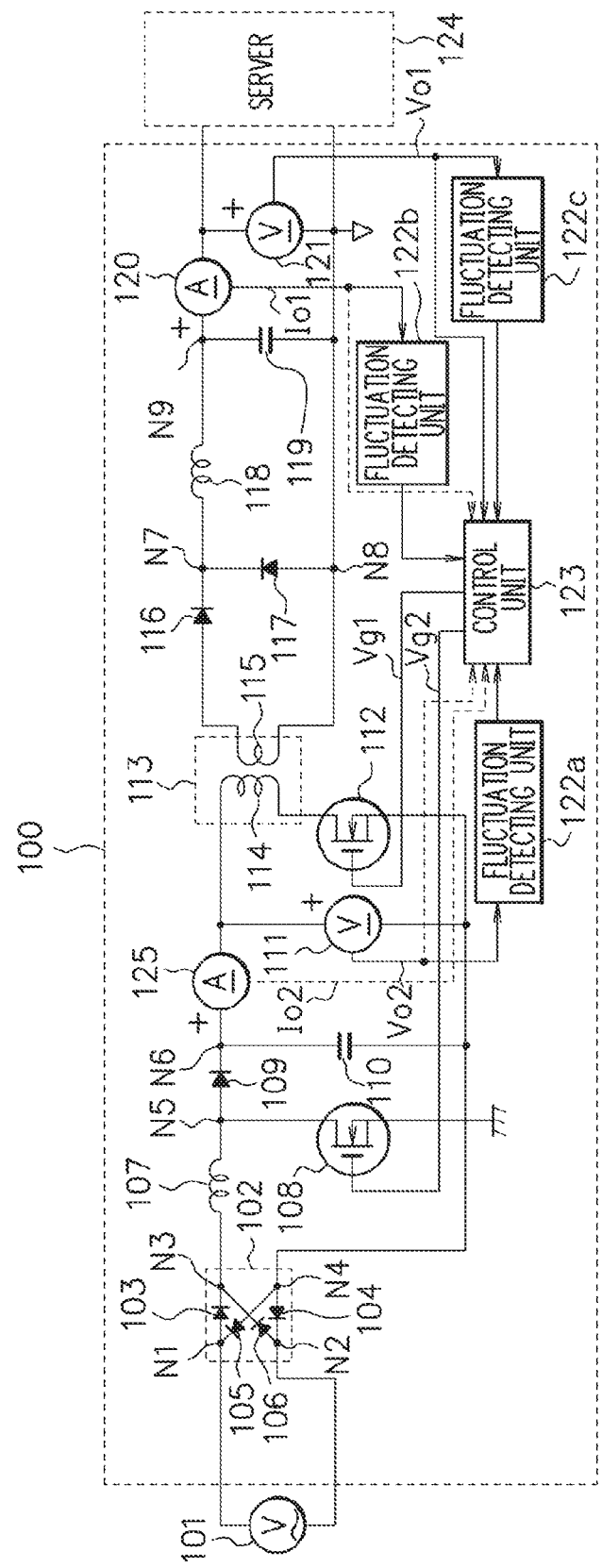
FIG. 1 is a diagram illustrating a configuration example of a power supply system according to a first embodiment.

FIG. 1 is a diagram illustrating a configuration example of a power supply system according to a first embodiment. The power supply system has an alternating-current power supply 101, a power supply circuit 100, and a server 124. The power supply circuit 100 is an alternating-current (AC)-direct-current (DC) power supply device, and includes a capacitor life diagnosis device. The power supply circuit 100 has a rectifying circuit 102, an inductor 107, an n-channel field-effect transistor 108, a diode 109, an electrolytic capacitor 110, a voltage detecting unit 111, an n-channel field-effect transistor 112, and a transformer 113. The power supply circuit 100 further has diodes 116, 117, an inductor 118, an electrolytic capacitor 119, a current detecting unit 120, a voltage detecting unit 121, fluctuation detecting units 122a to 122c, and a control unit 123. The transformer 113 includes a primary winding 114 and a secondary winding 115. The field-effect transistors 108 and 112 are preferably high electron mobility transistors (HEMTs) of gallium nitride (GaN) but may be MOS field-effect transistors. The HEMT has advantages such as high withstand voltage and high-speed switching. The power supply circuit 100 converts an alternating-current voltage inputted from the alternating-current power supply 101 to direct-current voltage and supplies the converted direct-current voltage as a power supply voltage to the server 124. Note that the power supply circuit 100 may supply the direct-current voltage to electronic devices other than the server 124.

The alternating-current power supply 101 is a commercial power supply such as a domestic wall outlet, and supplies an alternating-current voltage of, for example, 100 to 240 V between input nodes N1 and N2 of the power supply circuit 100. The rectifying circuit 102 has diodes 103 to 106. The diode 103 has an anode connected to the node N1 and a cathode connected to a node N3. The diode 104 has an anode connected to a node N4 and a cathode connected to the node N2. The diode 105 has an anode connected to the node N4 and a cathode connected to the node N1. The diode 106 has an anode connected to the node N2 and a cathode connected to the node N3. The rectifying circuit 102 full-wave rectifies the alternating-current voltage between the nodes N1 and N2, and outputs the full-wave rectified voltage to between the nodes N3 and N4.

The inductor 107 is connected between the nodes N3 and N5. The field-effect transistor 108 has a drain connected to the node N5, a gate connected to the control unit 123, and a source connected to a reference potential node (ground potential node). The field-effect, transistor 108 is a power factor improvement circuit that controls the output voltage of the rectifying circuit 102 to a reference voltage (0 V) according to a control signal of the gate. The control unit 123 outputs a control pulse signal with a frequency higher than the frequency (50 Hz or 60 Hz) of the alternating-current power supply 101 to the gate of the field-effect transistor 108. The field-effect transistor 108 repeats on and of in a short cycle. The diode 109 has an anode connected to the node N5 and a cathode connected to a node N6. The electrolytic capacitor 110 is connected between the nodes N6 and N4.

The inductor 107, the field-effect transistor 108, the diode 109, and the electrolytic capacitor 110 constitute a boost chopper circuit. In a period when the field-effect transistor 108 is on, energy is accumulated in the inductor 107 by the output of the rectifying circuit 102. In contrast, in a period when the field-effect transistor 108 is off, the electrolytic capacitor 110 is charged by the voltage formed by superposing a voltage between both ends of the inductor 107 on the output voltage of the rectifying circuit 102. In other words, only in the period when the field-effect, transistor 108 is off, the electrolytic capacitor 110 is charged. The electrolytic capacitor 110 is charged with the voltage formed by boosting the voltage of the rectifying circuit 102. For example, when the alternating-current, power supply 101 outputs an alternating-current voltage of 100 V, the voltage between both ends of the electrolytic capacitor 110 becomes a direct-current voltage of 400 V. The electrolytic capacitor 110 outputs the charged voltage.

The voltage detecting unit 111 detects the output voltage of the electrolytic capacitor 110. The fluctuation detecting unit 122a detects the maximum value of fluctuation in the output voltage of the electrolytic capacitor 110 detected by the voltage detecting unit 111 every fixed time, and outputs the detected maximum value of fluctuation in the output voltage to the control unit 123.

The primary winding 114 of the transformer 113 is connected between the node N6 and the drain of the field-effect transistor 112. The field-effect transistor 112 has a gate connected to the control unit 123 and a source connected to the node N4. The secondary winding 115 is connected between the anode of the diode 116 and a node N8. The node N8 is a ground potential node. The cathode of the diode 116 is connected to a node N7. The diode 117 has an anode connected to the node N8 and a cathode connected to the node N7. The inductor 118 is connected between the nodes N7 and N9. The electrolytic capacitor 119 is connected between the nodes N9 and N8.

The transformer 113 transforms the voltage of the primary winding 114 outputted from the electrolytic capacitor 110, and outputs the transformed voltage to the secondary winding 115. More specifically, when voltage is applied to the primary winding 114, a voltage lower than the voltage of the primary winding 114 is generated in the secondary winding 115. The diodes 116 and 117 constitute a rectifying circuit, which rectifies the voltage of the secondary winding 115.

The inductor 118 and the electrolytic capacitor 119 constitute a smoothing circuit, which smooths the voltage of the node N7 and outputs the smoothed voltage. The voltage between the nodes N9 and N8 is for example, a direct-current voltage of 19 V and is supplied as a power supply voltage to the server 124. The server 124 is a load on the power supply circuit 100.

The current detecting unit 120 detects the output current of the electrolytic capacitor 119. The fluctuation detecting unit 122b detects the maximum value of fluctuation in the output current of the electrolytic capacitor 119 detected by the current detecting unit 120 every fixed time, and outputs the detected maximum value of fluctuation in the output current to the control unit 123.

The voltage detecting unit 121 detects the output voltage of the electrolytic capacitor 119. The fluctuation detecting unit 122c detects the maximum value of fluctuation in the output voltage of the electrolytic capacitor 119 detected by the voltage detecting unit 121 every fixed time, and outputs the detected maximum value of fluctuation in the output voltage to the control unit 123.

To the gate of the field-effect transistor 112, a high-frequency pulse gate voltage is inputted. The control unit 123 controls the pulse width of the gate voltage of the field-effect transistor 112 according to the output voltage of the electrolytic capacitor 119 detected by the voltage detecting unit 121. More specifically, the control unit 123 increases the pulse width of the gate voltage or the field-effect transistor 112 when the output voltage of the electrolytic capacitor 119 is lower than the target value (for example, 19 V), and decreases the pulse width of the gate voltage of the field-effect transistor 112 when the output voltage of the electrolytic capacitor 119 is higher than the target value (for example, 19 V). This makes it possible to control the voltage between the nodes N9 and N8 to the voltage of the target value (for example, 19 V).

The control unit 123 is an output unit which predicts residual lives of the electrolytic capacitors 110 and 119 on the basis of temporal transition of the maximum values of fluctuation detected by the fluctuation detecting units 122a and 122c, and outputs signals indicating the residual lives of the electrolytic capacitors 110 and 119. Hereinafter, its details will be described. Note that the control unit 123 may be a computer including a processor, a memory, and a display unit.

Figure 2:
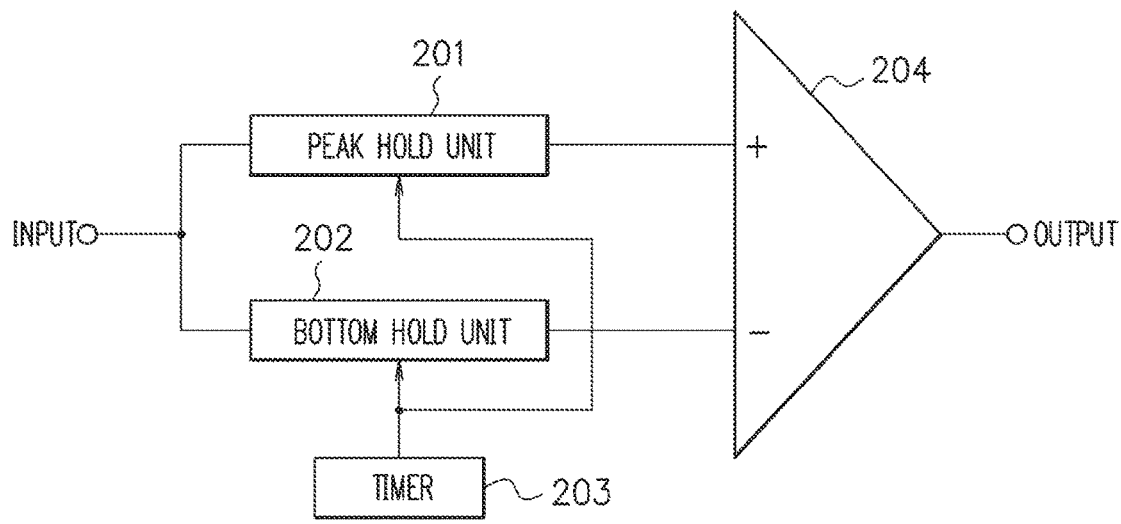
FIG. 2 is a diagram illustrating a configuration example of a fluctuation detecting unit in FIG. 1.

FIG. 2 is a diagram illustrating a configuration example of the fluctuation detecting unit 122a in FIG. 1. The fluctuation detecting unit 122a has a peak hold unit 201, a bottom hold unit 202, a timer 203, and a difference unit 204. The timer 203 resets values of the peak hold unit 201 and the bottom hold unit 202 every fixed time (for example, one day). The peak hold unit 201 detects the maximum value in the fixed time of the output voltage of the electrolytic capacitor 110. The bottom hold unit 202 detects the minimum value in the fixed time of the output voltage of the electrolytic capacitor 110. The difference unit 204 outputs the difference between the maximum value detected by the peak hold unit 201 and the minimum value detected by the bottom hold unit 202, as the maximum value of fluctuation in the output voltage of the electrolytic capacitor 110 to the control unit 123.

Next, the fluctuation detecting unit 122b in FIG. 1 will be described. The fluctuation detecting unit 122b has, similarly to the above-described fluctuation detecting unit 122a, a peak hold unit 201, a bottom hold unit 202, a timer 203, and a difference unit 204. The timer 203 resets values of the peak hold unit 201 and the bottom hold unit 202 every fixed time (for example, one day). The peak hold unit 201 detects the maximum value in the fixed time of the output current of the electrolytic capacitor 119. The bottom hold unit 202 detects the minimum value in the fixed time of the output current of the electrolytic capacitor 119. The difference unit 204 outputs the difference between the maximum value detected by the peak hold unit 201 and the minimum value detected by the bottom hold unit 202, as the maximum value of fluctuation in the output current of the electrolytic capacitor 119 to the control unit 123.

Next, the fluctuation detecting unit. 122c in FIG. 1 will be described. The fluctuation detecting unit 122c has, similarly to the above-described fluctuation detecting unit 122c, a peak hold unit 201, a bottom hold, unit 202, a timer 203, and a difference unit 204. The timer 203 resets values of the peak hold unit 201 and the bottom hold unit 202 every fixed time (for example, one day). The peak hold unit 201 detects the maximum value in the fixed time of the output voltage of the electrolytic capacitor 119. The bottom hold unit 202 detects the minimum value in the fixed time of the output voltage of the electrolytic capacitor 119. The difference unit 204 outputs the difference between the maximum value detected by the peak hold unit 201 and the minimum value detected by the bottom hold unit 202, as the maximum value of fluctuation in the output voltage of the electrolytic capacitor 119 to the control unit 123.

Figure 3:
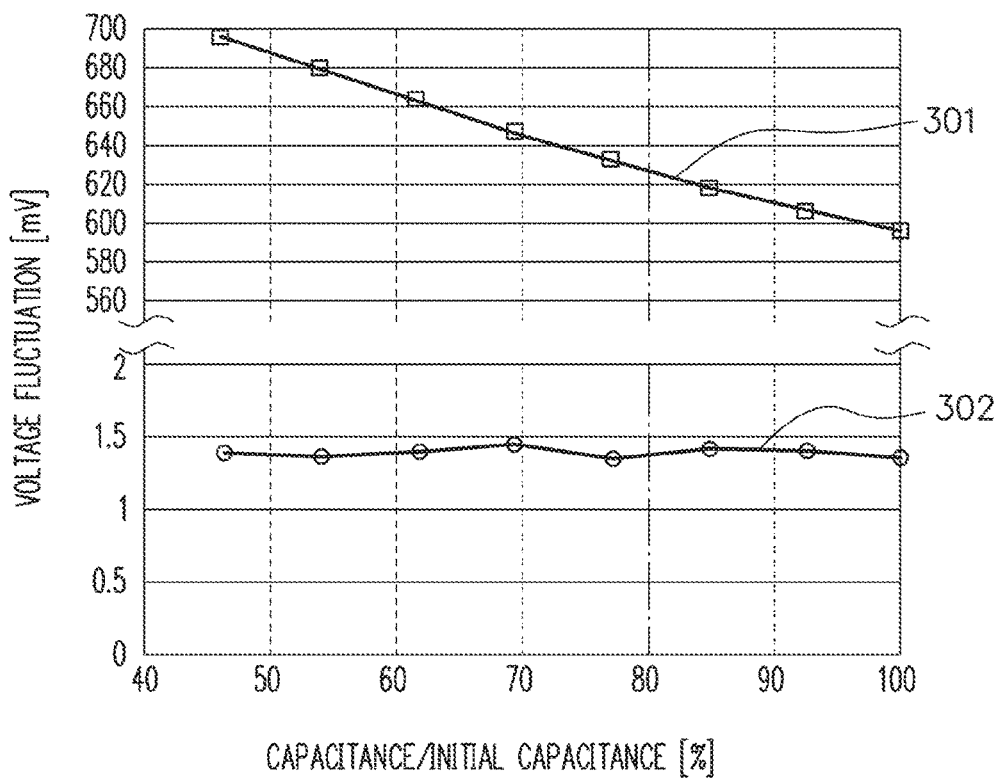
FIG. 3 is a graph representing the relationship between an output voltage fluctuation value of an electrolytic capacitor and a capacitance decrease.

FIG. 3 is a graph representing the relationship between an output voltage fluctuation value of the electrolytic capacitor 110 or 119 and a capacitance decrease. The vertical axis represents a fluctuation value [mV] of the output voltage of the electrolytic capacitor 110 or 119. The horizontal axis represents a percentage [%] of a present capacitance to an initial capacitance of the electrolytic capacitor 110 or 119. A characteristic line 301 represents the fluctuation value of the output voltage of the electrolytic capacitor 110 or 119 when the load (server 124) on the power supply circuit 100 fluctuates from 50% to 100%. A characteristic line 302 represents the fluctuation value of the output voltage of the electrolytic capacitor 110 or 119 by switching of the field-effect transistors 108 and 112. As represented by the characteristic line 302, even when the percentage of the present capacitance to the initial capacitance changes, the output voltage fluctuation value by switching of the field-effect transistors 108 and 112 hardly changes. In contrast, as represented by the characteristic line 301, when the percentage of the present capacitance to the initial capacitance changes, the output voltage fluctuation value by the load fluctuation greatly changes. In other words, by detecting the fluctuation values of the output voltages of the electrolytic capacitors 110 and 119 using the characteristic line 301, it is possible to know the percentages of the present capacitances to the initial capacitances of the electrolytic capacitors 110 and 119. For example, it is specified in some cases that when the percentage of the present capacitance to the initial capacitance of an electrolytic capacitor becomes 80% or less, its operation is not guaranteed due to the life of the electrolytic capacitor. In this case, the life of the electrolytic capacitor can be determined using an output voltage fluctuation value (about 628 mV) corresponding to a percentage of the present capacitance to the initial capacitance of 80% as a threshold value Va (FIG. 5). Here, to obtain the characteristic line 301, a load fluctuation of a predetermined value or more is necessary. Hereinafter, the load fluctuation will be described referring to FIG. 4.

Figure 4:
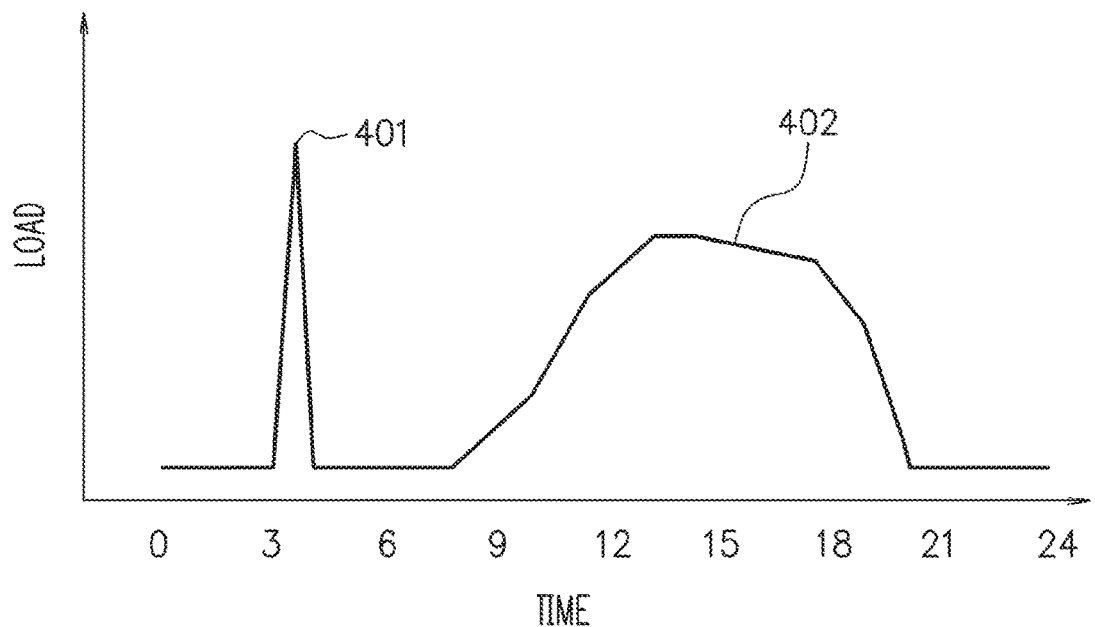
FIG. 4 is a chart illustrating an example of load fluctuation in one day of a server.
Figure 5:
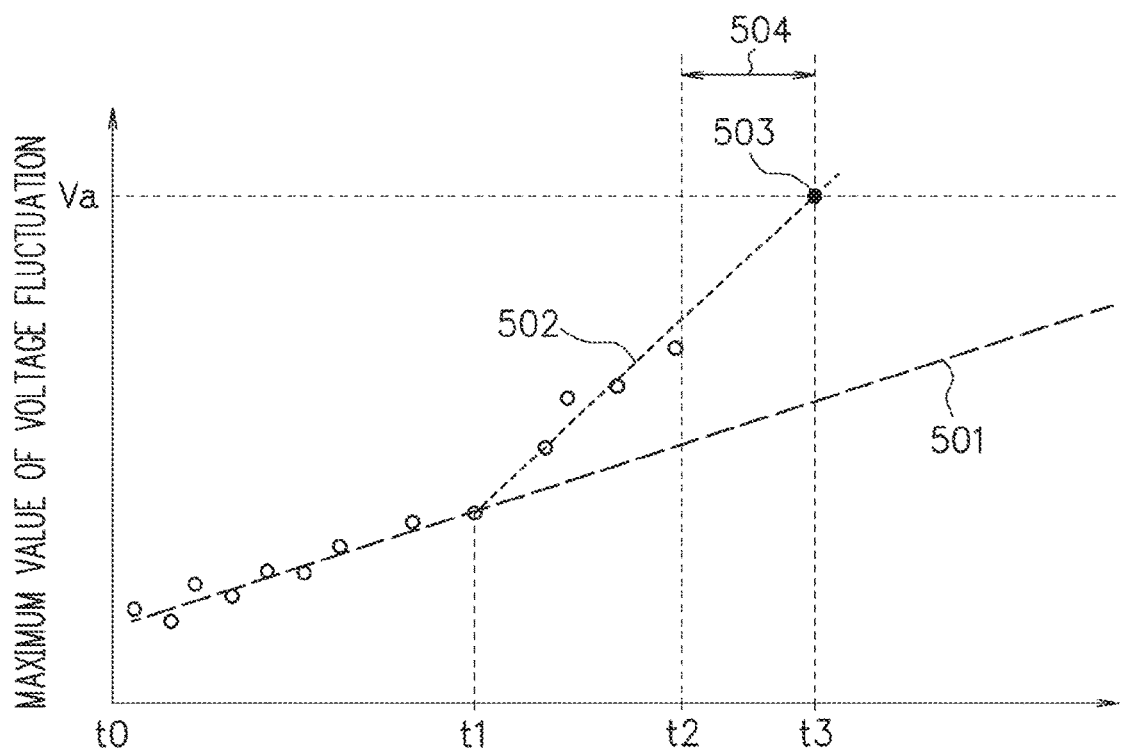
FIG. 5 is a chart illustrating temporal transition of the maximum value every fixed time of fluctuation in output voltage of the electrolytic capacitor.

FIG. 4 is a chart illustrating an example of the load fluctuation in one day of the server 124. The horizontal axis represents 24 hours of one day. The vertical axis represents the load of the server 124. For example, a load fluctuation 401 is generated in the server 124 due to timed backup processing at night. The load fluctuation 401 takes almost the same fluctuation value every day. Further, a load fluctuation 402 is generated in the server 124 due to routine work in the daytime. The load fluctuation 402 changes daily. Therefore, the fluctuation detecting units 122a to 122c only need to be able to detect the periodic and large load fluctuation 401. For example, the fluctuation detecting units 122a to 122c only need to detect the fluctuation value every day. From the load fluctuation 401, the characteristic line 301 in FIG. 3 can be obtained.

FIG. 5 is a chart illustrating the temporal transition of the maximum value every fixed time (for example, one day) of fluctuation in the output voltage of the electrolytic capacitor 110 or 119. The horizontal axis represents time. The vertical axis represents the maximum value every fixed time (for example, one day) of fluctuation in the output voltage of the electrolytic capacitor 110 or 119. From times t0 to t1, the maximum value in the fixed time of fluctuation in the output voltage of the electrolytic capacitor 110 or 119 is detected according to a life characteristic line 501. At the time t1, the electrolytic capacitor 110 or 119 changes in some cases from the life characteristic line 501 to a life characteristic line 502 from any cause. Then, from times t1 to t2, the maximum value in the fixed time of fluctuation in the output voltage of the electrolytic capacitor 110 or 119 is detected according to the life characteristic line 502.

Here, the threshold value Va is the output voltage fluctuation value (about 628 mV) corresponding to a percentage of the present capacitance to the initial capacitance of 80% in the characteristic line 301 in FIG. 3. At the time t2, the control unit 123 finds the life characteristic line 502 by the least-squares method on the basis of the temporal transition from the times t1 to t2 of the maximum values of fluctuation in the output voltages detected by the fluctuation detecting units 122a and 122c, predicts a characteristic point 503 corresponding to the threshold value Va by extrapolation of the life characteristic line 502, and predicts a life time t3 corresponding to the characteristic point 503. The control unit 123 can further predict a residual life 504 obtained by subtracting the current time t2 from the life time t3. The residual life 504 is a residual life of the electrolytic capacitor 110 or 119.

Figure 6:
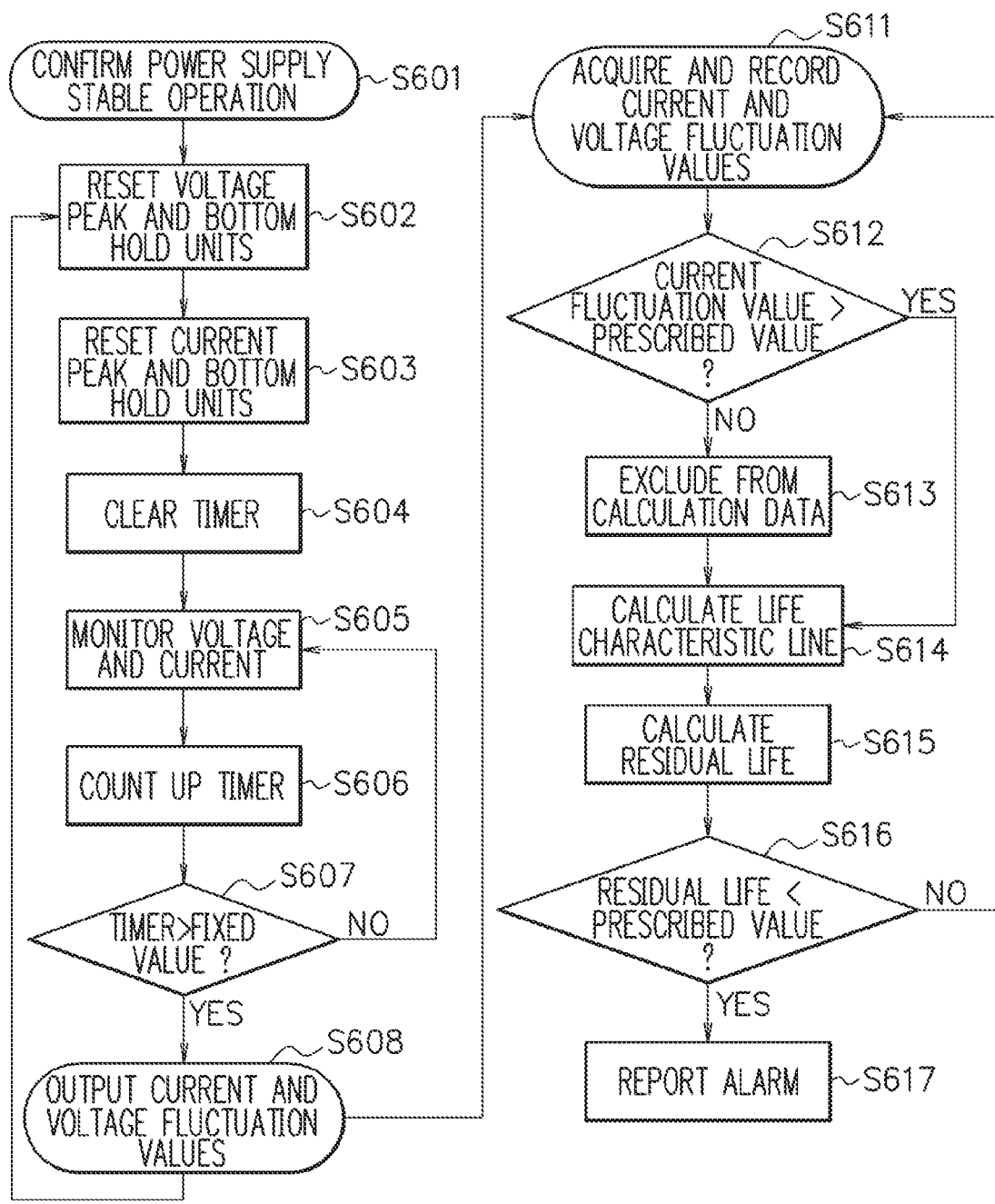
FIG. 6 is a flowchart illustrating a capacitor life diagnosis method of a power supply circuit.

FIG. 6 is a flowchart illustrating a capacitor life diagnosis method of the power supply circuit 100. At Step S601, the power supply circuit 100 confirms a stable operation, and then proceeds to Step S602. At Step S602, in the fluctuation detecting unit 122a, the timer 203 resets the value of the peak hold unit 201 and the value of the bottom hold unit 202, and in the fluctuation detecting unit 122c, the timer 203 resets the value of the peak hold unit 201 and the value of the bottom hold unit 202. Next, at Step S603, in the fluctuation detecting unit 122b, the timer 203 resets the value of the peak hold unit 201 and the value of the bottom hold unit 202. Next, at Step S604, the fluctuation detecting units 122a to 122c clear the values of the timers 203, respectively.

Next, at Step S605, in the fluctuation detecting unit 122a, the peak hold unit 201 updates the maximum value held therein when the present output voltage of the electrolytic capacitor 110 is larger than the maximum value, and the bottom hold unit 202 updates the minimum value held therein when the present output voltage of the electrolytic capacitor 110 is smaller than the minimum value. Further, in the fluctuation detecting unit 122b, the peak hold unit 201 updates the maximum value held therein when the present output current of the electrolytic capacitor 119 is larger than the maximum value, and the bottom hold unit 202 updates the minimum value held therein when the present output current of the electrolytic capacitor 119 is smaller than the minimum value. Further, in the fluctuation detecting unit 122c, the peak hold unit 201 updates the maximum value held therein when the present output voltage of the electrolytic capacitor 119 is larger than the maximum value, and the bottom hold unit 202 updates the minimum value held therein when the present output voltage of the electrolytic capacitor 119 is smaller than the minimum value.

Next, at Step S606, the fluctuation detecting units 122a to 122c count up the values of the timers 203, respectively. Next, at Step S607, the fluctuation detecting units 122a to 122c check whether or not the values of the timers 203 are larger than a fixed value (for example, one day). When the values of the timers 203 are equal to or smaller than the fixed value, the power supply circuit 100 returns to Step S605 and repeats the above-described processing. Thus, in the fluctuation detecting unit 122a, the peak hold unit 201 detects the maximum value of the output voltage of the electrolytic capacitor 110 every fixed time, and the bottom hold unit 202 detects the minimum value of the output voltage of the electrolytic capacitor 110 every fixed time. Further, in the fluctuation detecting unit 122b, the peak hold unit 201 detects the maximum value of the output current of the electrolytic capacitor 119 every fixed time, and the bottom hold unit 202 detects the minimum value of the output current of the electrolytic capacitor 119 every fixed time. Further, in the fluctuation detecting unit 122c, the peak hold unit 201 detects the maximum value of the output voltage of the electrolytic capacitor 119 every fixed time, and the bottom hold unit 202 detects the minimum value of the output voltage of the electrolytic capacitor 119 every fixed time.

At Step S607, when the values of the timers 203 are larger than the fixed value, the power supply circuit 100 proceeds to Step S608. At Step S608, in the fluctuation detecting unit 122a, the difference unit 204 outputs the difference between the maximum value held by the peak hold unit 201 and the minimum value held by the bottom hold unit 202, as the maximum value of fluctuation in the output voltage of the electrolytic capacitor 110 to the control unit 123. Further, in the fluctuation detecting unit 122b, the difference unit 204 outputs the difference between the maximum value held by the peak hold unit 201 and the minimum value held by the bottom hold unit 202, as the maximum value of fluctuation in the output current of the electrolytic capacitor 119 to the control unit 123. Further, in the fluctuation detecting unit 122c, the difference unit 204 outputs the difference between the maximum value held by the peak hold unit 201 and the minimum value held by the bottom hold unit 202, as the maximum value of fluctuation in the output voltage of the electrolytic capacitor 119 to the control unit 123. Thereafter, the power supply circuit 100 returns to Step S602 and repeats the above-described processing, and proceeds to Step S611.

At Step S611, the control unit 123 records, in the internal memory, the maximum value of fluctuation in the output voltage of the electrolytic capacitor 110 outputted from the fluctuation detecting unit 122a, the maximum value of fluctuation in the output current of the electrolytic capacitor 119 outputted from the fluctuation detecting unit 122b, and the maximum value of fluctuation in the output voltage of the electrolytic capacitor 119 outputted from the fluctuation detecting unit 122c.

Next, at Step S612, the control unit 123 checks whether or not the maximum value of fluctuation in the output current of the electrolytic capacitor 119 is larger than a prescribed value (threshold value). The case where it is larger than the prescribed value means that the load fluctuation is larger than a predetermined value, and therefore the power supply circuit 100 proceeds to Step S614. The case where it is equal to or smaller than the prescribed value means that the load fluctuation is equal to or smaller than the predetermined value, and therefore the power supply circuit 100 proceeds to Step S613. At Step S613, the reliability of the characteristic line 301 in FIG. 3 is low, and therefore the maximum values of fluctuation in the output voltages of the electrolytic capacitors 110 and 119 which are detected in the same period with the maximum value of fluctuation in the output current of the electrolytic capacitor 119, are excluded from calculation at Step S614. This makes it possible to improve the accuracy of prediction of residual life. Note that Steps S612 and S613 may be omitted. Thereafter, the power supply circuit 100 proceeds to Step S614.

At Step S614, the control unit 123 derives the life characteristic line 502 of the electrolytic capacitor 110 as illustrated in FIG. 5 on the basis of the temporal transition of the maximum value of fluctuation in the output voltage of the electrolytic capacitor 110. Further, the control unit 123 derives the life characteristic line 502 of the electrolytic capacitor 119 as illustrated in FIG. 5 on the basis of the temporal transition of the maximum value of fluctuation in the output voltage of the electrolytic capacitor 119.

Next, at Step S615, the control unit 123 predicts, as illustrated in FIG. 5, the life characteristic point 503 by extrapolation of the life characteristic line 502 of the electrolytic capacitor 110, and predicts the residual life 504 of the electrolytic capacitor 110 on the basis of the life characteristic point 503. Further, the control unit 123 predicts, as illustrated in FIG. 5, the life characteristic point 503 by extrapolation of the life characteristic line 502 of the electrolytic capacitor 119, and predicts the residual life 504 of the electrolytic capacitor 119 on the basis of the life characteristic point 303.

Next, at Step S616, the control unit 123 checks whether or not the residual life 504 of the electrolytic capacitor 110 or 119 is shorter than a prescribed value. When it is shorter than the prescribed value, the power supply circuit 100 proceeds to Step S617, and when it is equal to or more than the prescribed value, the power supply circuit 100 returns to Step S611.

At Step S617, the control unit 123 outputs an alarm signal indicating that the residual life 504 of the electrolytic capacitor 110 or 119 is shorter than the prescribed value to thereby report an alarm. For example, the control unit 123 can turn on an alarm by a light-emitting diode (LED), display an alarm on a display, and make an alarm sound through a speaker. This makes it possible to report the time to replace the power supply circuit 100.

As described above, at Step S613, the control unit 123 excludes the maximum values of fluctuation in the output voltages detected by the fluctuation detecting units 122a and 122c when the maximum value of fluctuation in the output current detected by the fluctuation detecting unit 122b is smaller than the threshold value. Then, the control unit 123 predicts the residual lives 504 of the electrolytic capacitors 110 and 119 on the basis of the temporal transition of the maximum values of fluctuation in the output voltages detected by the fluctuation detecting units 122a and 122c when the maximum value of fluctuation in the output current detected by the fluctuation detecting unit 122b is larger than the threshold value. Then, the control unit 123 outputs signals indicating the residual lives 504 of the electrolytic capacitors 110 and 119.

Second Embodiment

Figure 7:
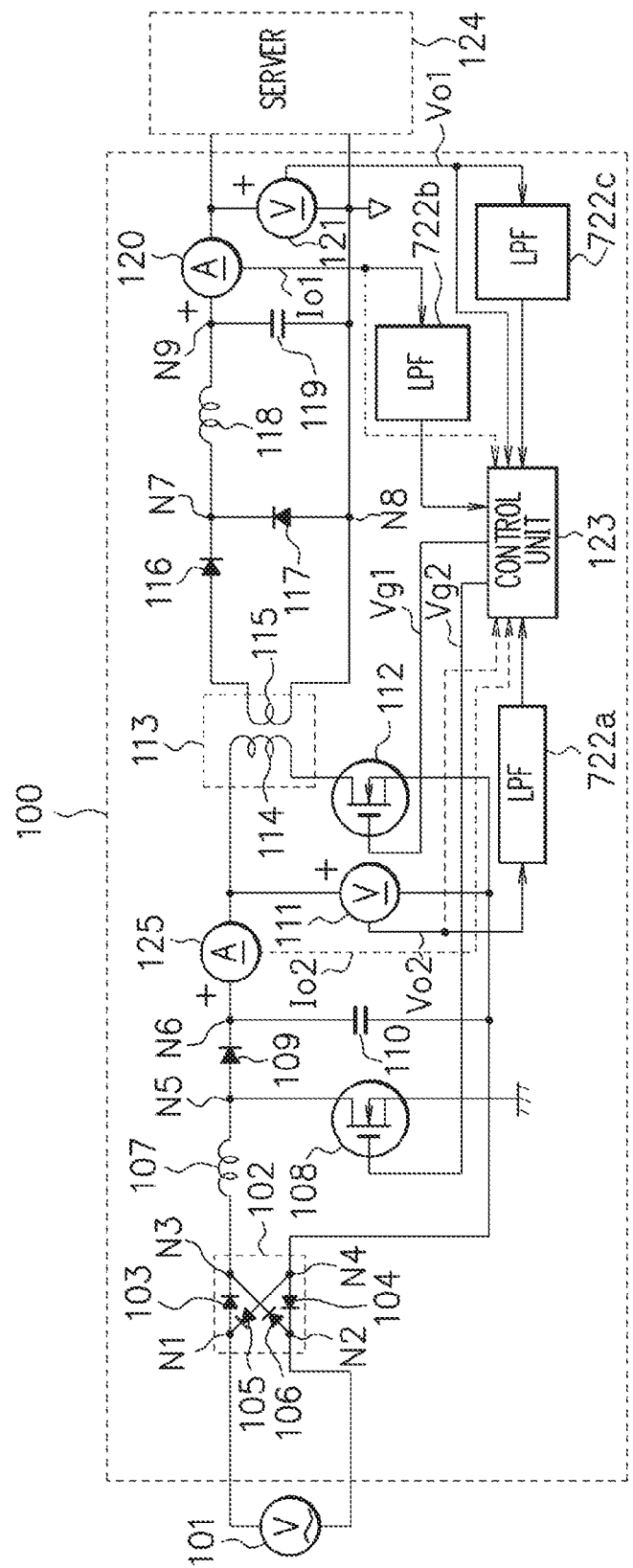
FIG. 7 is a diagram illustrating a configuration example of a power supply system according to a second embodiment.
Figure 8A:
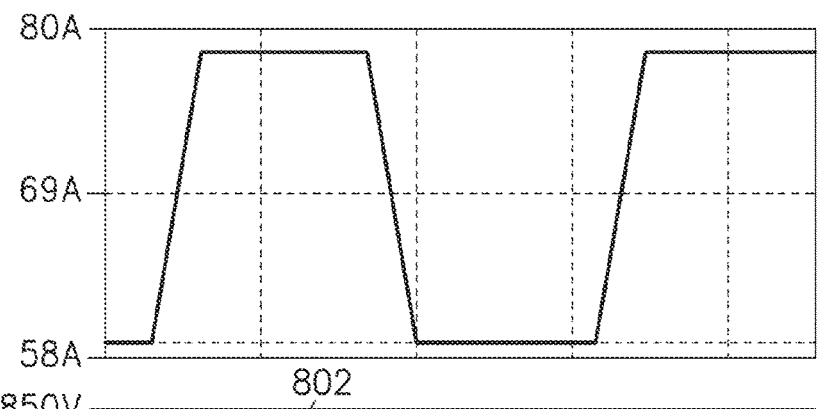
FIG. 8A to FIG. 8C are charts illustrating current waveform and voltage waveforms of simulation results.
Figure 8B:
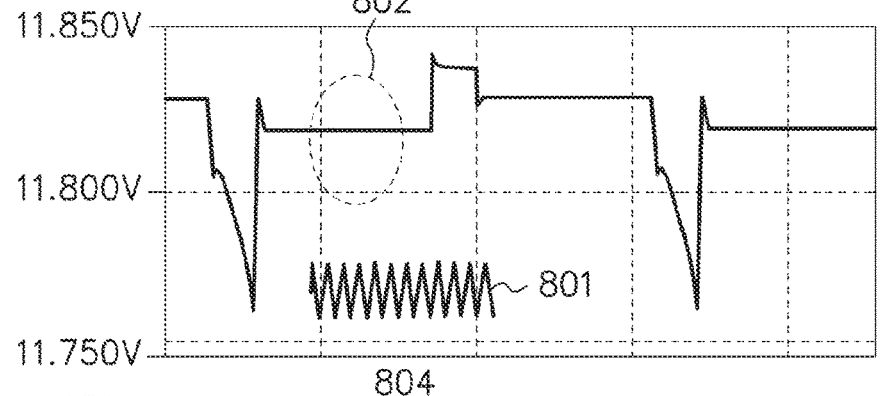
Figure 8C:
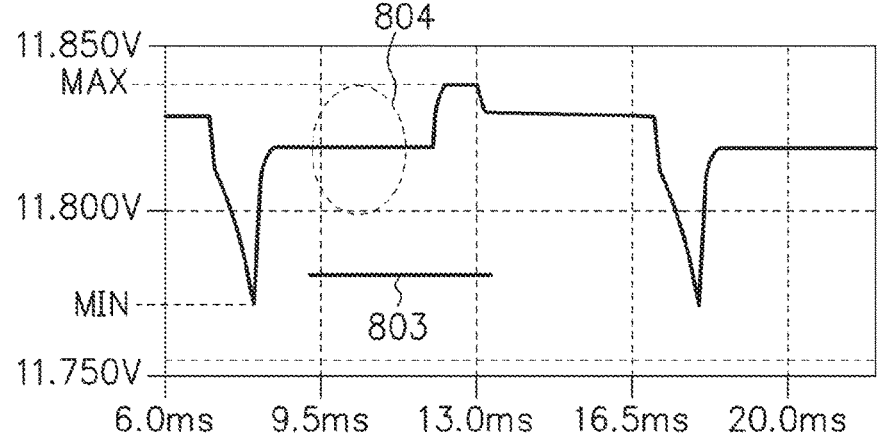

FIG. 7 is a diagram illustrating a configuration example of a power supply system according to a second embodiment. FIG. 8A to FIG. 8C are charts illustrating current waveforms and voltage waveforms of simulation results. This embodiment (FIG. 7) is made by providing low-pass filters 722a to 722b in place of the fluctuation detecting units 122a to 122c with respect to the first embodiment (FIG. 1). Hereinafter, points of this embodiment different from the first embodiment will be described.

The current detecting unit 120 detects, as in the first embodiment, the output current of the electrolytic capacitor 119 illustrated in FIG. 8A. The output current of the electrolytic capacitor 119 illustrated in FIG. 8A indicates current fluctuation accompanying load fluctuation. The voltage detecting unit 121 detects, as in the first embodiment, the output voltage of the electrolytic capacitor 119 illustrated in FIG. 8B. The output voltage of the electrolytic capacitor 119 illustrated in FIG. 8B indicates voltage fluctuation accompanying load fluctuation. A voltage waveform 801 indicates a waveform made by enlarging an area 802, and indicates voltage fluctuation by switching of the field-effect transistors 108 and 112. As described above, it is found that the voltage fluctuation by switching is considerably smaller than the voltage fluctuation by load fluctuation. The voltage detecting unit 111 detects, as in the first embodiment, the output voltage of the electrolytic capacitor 110.

A low-pass filter 722c performs low-pass filtering on the output voltage of the electrolytic capacitor 119 detected by the voltage detecting unit 121, and outputs the low-pass filtered output voltage illustrated in FIG. 8C to the control unit 123. A voltage waveform 803 indicates a waveform made by enlarging an area 804, and it is found that the voltage fluctuation by the switching of the field-effect transistors 108 and 112 disappeared and the output voltage is constant voltage. The control unit 123 detects a maximum value MAX and a minimum value MIN in a fixed time of the output voltage illustrated in FIG. 8C, and detects the difference between the maximum value MAX and the minimum value MIN as the maximum value of fluctuation in the output voltage of the electrolytic capacitor 119.

Similarly, the low-pass filter 722a performs low-pass filtering on the output voltage of the electrolytic capacitor 110 detected by the voltage detecting unit 111, and outputs the low-pass filtered output voltage to the control unit 123. Further, the low-pass filter 722a performs low-pass filtering on the output current of the electrolytic capacitor 119 detected by the current detecting unit 120, and outputs the low-pass filtered output current to the control unit 123.

The control unit 123 performs processing of the fluctuation detecting units 122a to 122c in FIG. 1. More specifically, the control unit 123 detects, similarly to the fluctuation detecting unit 122a, the maximum value in the fixed time of fluctuation in the output voltage of the electrolytic capacitor 110 outputted from the low-pass filter 722a. Further, the control unit 123 detects, similarly to the fluctuation detecting unit 122b, the maximum value in the fixed time of fluctuation in the output current of the electrolytic capacitor 119 outputted from the low-pass filter 722b. Further, the control unit 123 detects, similarly to the fluctuation detecting unit 122c, the maximum value in the fixed time of fluctuation in the output voltage of the electrolytic capacitor 119 outputted from the low-pass filter 722c. Thereafter, the control unit 123, as in the first embodiment, predicts the residual lives 501 of the electrolytic capacitors 110 and 119, and reports an alarm.

Third Embodiment

Figure 9:
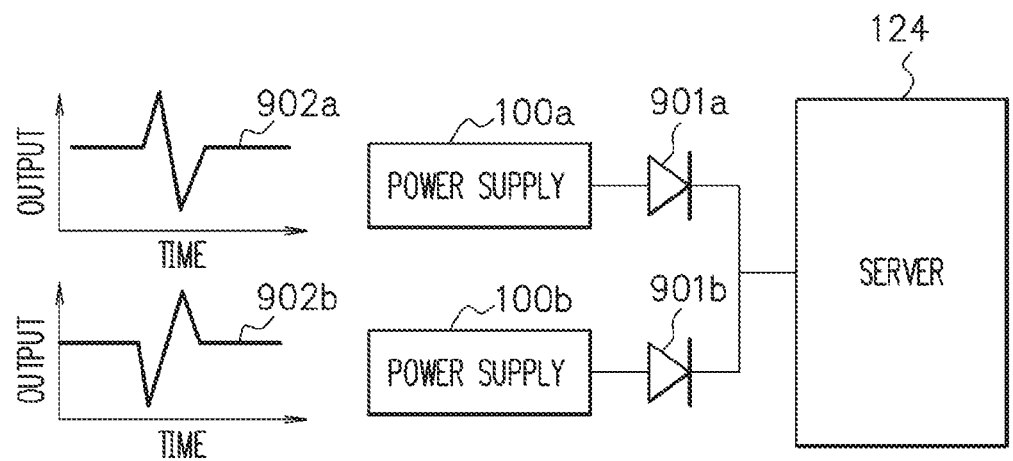
FIG. 9 is a diagram illustrating a configuration example of a power supply system according to a third embodiment.

FIG. 9 is a diagram illustrating a configuration example of a power supply system according to a third embodiment. The power supply system has the power supply device and the server 124. The power supply device has a power supply circuit 100a, a diode 901a, a power supply circuit 100b, and a diode 901b. Each of the power supply circuits 100a and 100b has the same configuration as that of the power supply circuit 100 in FIG. 1. The diode 901a has an anode connected to an output terminal of the power supply circuit 100a and a cathode connected to a power supply terminal of the server 124. The diode 901b has an anode connected to an output terminal of the power supply circuit 100b and a cathode connected to the power supply terminal of the server 124. The power supply circuits 100a and 100b supply a power supply voltage to the server 124. A waveform 902a indicates a waveform of the output voltage of the power supply circuit 100a. A waveform 902b indicates a waveform of the output voltage of the power supply circuit 100b. When the server 124 holds a middle load or a heavy load at all times as a cloud server, the load of the server 124 is fluctuated by intentionally fluctuating the output voltage of any one of the power supply circuits 100a and 100b. By the load fluctuation, the maximum values of fluctuation in the output voltages of the electrolytic capacitors 110 and 119 can be acquired. Thereafter, the power supply circuit 100b is allowed to return the output voltage to a fixed value.

Fourth Embodiment

Figure 10A:
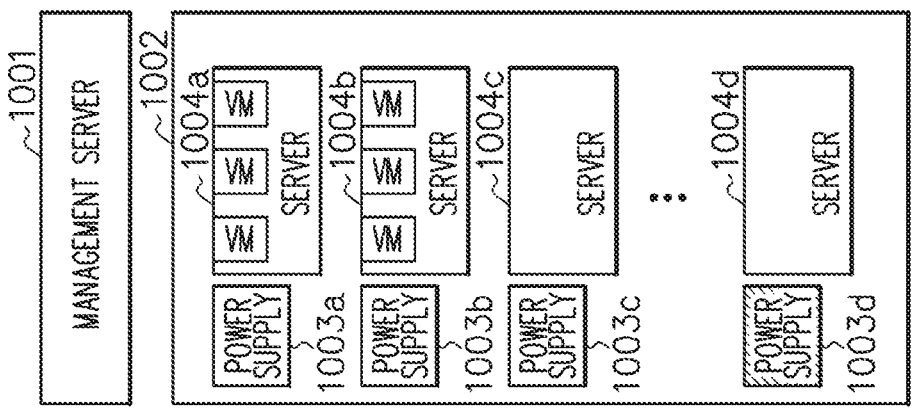
FIG. 10A to FIG. 10C are diagrams illustrating a power supply system according to a fourth embodiment.

FIG. 10A is a diagram illustrating a configuration example of a power supply system according to a fourth embodiment. The power supply system has a management server 1001 and a server group 1002. The server group 1002 has a plurality of power supply circuits (power supply devices) 1003a to 1003d and a plurality of servers 1004a to 1004d. The plurality of power supply circuits 1003a to 1003d each have the configuration of the power supply circuit 100 in FIG. 7 and supply a power supply voltage to the plurality of servers 1004a to 1004d, respectively. However, the management server 1001 performs processing of the control unit 123 in FIG. 7. The management server 1001 is a control device and allocates a plurality of virtual machines VM to the plurality of servers 1004a to 1004d.

The management server 1001 detects the maximum values of fluctuation in the output voltages of the electrolytic capacitors 110 and 119 accompanying load fluctuation of the electrolytic capacitors 110 and 119 of the plurality of power supply circuits 1003a to 1003d every fixed time, respectively. Then, the management server 1001 predicts the residual lives 504 of the electrolytic capacitors 110 and 119 of the plurality of power supply circuits 1003a to 1003d on the basis of the temporal transition of the detected maximum values of fluctuation in the output voltages. Then, the management server 1001 allocates, at the time of load fluctuation, the plurality of virtual machines VM to the plurality of servers 1004a to 1004d according to the predicted residual lives 504 of the electrolytic capacitors 110 and 119 of the plurality of power supply circuits 1003a to 1003d.

Figure 10B:
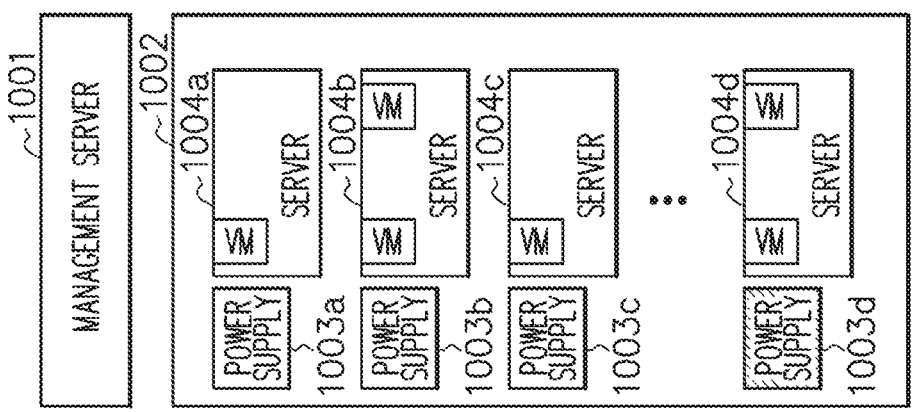

For example, FIG. 10A illustrates an example in which the management server 1001 allocates the virtual machines VM in the servers 1004a to 1004d for heavy load. After the state in FIG. 10A, when the load is switched from the heavy load to a light load, the management server 1001 reallocates the virtual machines VM to the servers 1004a to 1004d for reduction of power consumption as illustrated in FIG. 10B. In this event, the management server 1001 reduces the number of the virtual machines VM in the server 1004d to which the power supply voltage is supplied from the power supply circuit 1003d having a shorter residual life 504, from three to two. In other words, the management server 1001 allocates the virtual machines VM more preferentially to the servers 1004a to 1004c to which the power supply voltage is supplied from the power supply circuits 1003a to 1003c having longer residual lives 504 than to the server 1004d to which the power supply voltage is supplied from the power supply circuit 1003d having a shorter residual life 504. This makes it possible to reduce the frequency of use of the server 1004d corresponding to the power supply circuit 1003d which is lower in reliability. Then, the frequency of use of the power supply circuit 1003d is reduced, whereby the decrease in residual life 504 of the power supply circuit 1003d can be delayed. This makes it possible to level the residual lives of all of the power supply circuits 1003a to 1003d so as to reduce the cost of replacing the power supply circuit.

Figure 10C:
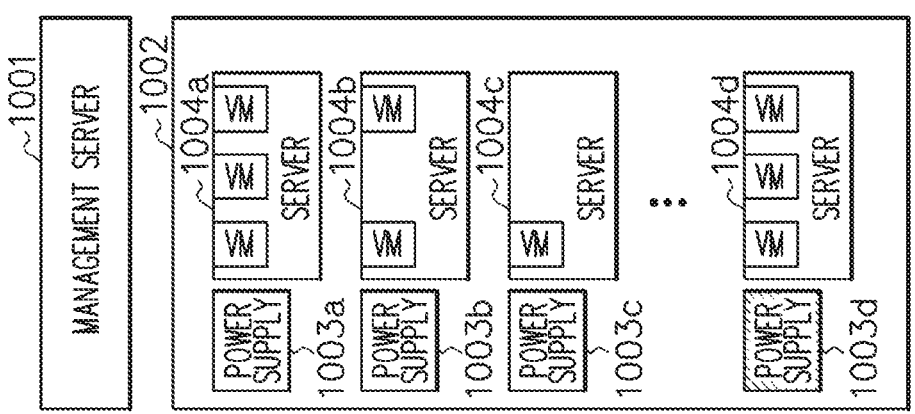

After the state in FIG. 10B, when the load is switched from the light load to a heavy load, the management server 1001 reallocates the virtual machines VM to the servers 1004a to 1004d for reduction of power consumption as illustrated in FIG. 10C. In this event, the management server 1001 reduces the number of the virtual machines VM in the server 1004d to which the power supply voltage is supplied from the power supply circuit 1003d having a shorter residual life 504, from two to zero. In other words, the management server 1001 allocates the virtual machines VM more preferentially to the servers 1004a to 1004c to which the power supply voltage is supplied from the power supply circuits 1003a to 1003c having longer residual lives 504 than to the server 1004d to which the power supply voltage is supplied from the power supply circuit 1003d having a shorter residual life 504. When the number of the virtual machines VM allocated to the server 1004d becomes zero, the power supply circuit 1003d and the server 1004d come into a stop state, and the power supply circuit 1003d having a shorter residual life 504 becomes replaceable.

As described above, according to this embodiment, allocating the virtual machines VM preferentially to the servers 1004a to 1004c corresponding to the power supply circuits 1003a to 1003c having longer residual lives 504, advances leveling of the residual lives 504 of the power supply circuits 1003a to 1003d to thereby reduce the cost of replacing the power supply circuit.

Besides, repeating the above-described reallocation of the virtual machines VM for a long time increases the frequency that the server 1004d corresponding to the power supply circuit 1003d having a shorter residual life 504 and having a higher maintenance priority comes into a stop state, eliminates the need to move again the virtual machines VM or stop the server 1004d at the time when executing the maintenance, and thereby enables reduction in maintenance cost.

Besides, for users using the servers 1004a to 1004d as a data center, the possibility of the failure of the power supply circuits 1003a, 1003b corresponding to the servers 1004a, 1004b in which the virtual machines VM are operating can be reduced to improve the reliability. Besides, it is possible to allocate the virtual machines VM of users who place importance on the reliability and pay a higher fee, preferentially to the servers 1004a to 1004c corresponding to the power supply circuits 1003a to 1003c having longer residual lives 504. Besides, allocation of the virtual machine VM of a user who places importance on cost and approves temporary suspension of the virtual machine VM to the server 1004d corresponding to the power supply circuit 1003d having a shorter residual life 504, eliminates excessive redundancy and contributes to improvement in profit and loss in the whole data center.

Fifth Embodiment

FIG. 11A is a diagram illustrating a configuration example of a part of the control unit 123 in FIG. 1 and FIG. 7 according to a fifth embodiment. The control unit 123 has a microcomputer 1100, low-pass filters 1101, 1107, gain units 1102, 1105, 1108, analog-digital converters 1103, 1106, 1109, and a target voltage unit 1104. As illustrated in FIG. 11C, the microcomputer 1100 is a computer and has a digital signal processor (DPS) 1121, a timer 1122, a ROM 1123 and a RAM 1124. The DSP 1121 performs digital signal processing. The timer 1122 counts a timer value. The ROM 1123 stores a program and so on. The RAM 1124 is a working area of the ROM 1123. The DSP 1121 executes the program in the ROM 1123 and thereby performs various kinds of processing including processing of the capacitor life diagnosis methods in the first to fourth embodiments and processing of functional modules 1110 to 1115 in FIG. 11A. The microcomputer 1100 has as functional modules of the program, a subtracting unit 1110, a compensator 1111, a reduction ratio calculating unit 1112, a timer 1113, a duty ratio changing unit 1114, and a pulse width modulating (PWM) unit 1115.

The voltage detecting unit 121 in FIG. 1 and FIG. 7 detects an output voltage Vo1 of the electrolytic capacitor 119. The low-pass filter 1101 outputs the output voltage Vo1 detected by the voltage detecting unit 121 after attenuating a frequency component thereof higher than a cut-off frequency. The gain unit 1102 outputs a voltage obtained by multiplying the output voltage of the low-pass filter 1101 by a gain k1. The analog-digital converter 1103 converts the output voltage of the gain unit 1102 from analog to digital, and outputs a digital output voltage Vd1 to the microcomputer 1100.

The target voltage unit 1104 outputs a target voltage Vt1. The target voltage Vt1 is, for example, 19 V. The gain unit 1105 outputs a voltage obtained by multiplying the target voltage Vt1 by a gain k2. The analog-digital converter 1106 converts the output voltage of the gain unit 1105 from analog to digital, and outputs a digital target voltage Vd2 to the microcomputer 1100.

The subtracting unit 1110 subtracts the digital output voltage Vd1 from the digital target voltage Vd2, and outputs a subtraction result. The compensator 1111 is a duty ratio computing unit which computes a duty ratio of a gate voltage Vg1 of the field-effect transistor 112 on the basis of the output value of the subtracting unit 1110. The duty ratio of the gate voltage Vg1 is a value obtained by dividing a high-level time of the gate voltage Vg1 by a cycle of the gate voltage Vg1. The duty ratio changing unit 1114 usually outputs the duty ratio computed by the compensator 1111 to the PWM unit 1115 without changing the computed duty ratio. The PWM unit 1115 outputs the gate voltage Vg1 modulated in pulse width on the basis of the duty ratio outputted from the duty ratio changing unit 1114, to the gate of the field-effect transistor 112. Thus, the microcomputer 1100 generates the gate voltage Vg1 to make the output voltage Vo1 get closer to the target voltage Vt1.

In the first to fourth embodiments, the control unit 123 detects the maximum value of fluctuation in the output voltage Vo1 of the electrolytic capacitor 119 accompanying rapid load fluctuation of the electrolytic capacitor 119, but has difficulty in predicting the residual life of the electrolytic capacitor 119 when steadily operating with the constant output voltage Vo1. In this embodiment, the microcomputer 1100 forcibly changes, as illustrated in FIG. 11B, the pulse width (duty ratio) of the gate voltage Vg1 of the field-effect transistor 112 for only one pulse during stable operation to generate fluctuation in the output voltage Vo1 equivalent to the rapid load fluctuation. However, the change amount of the duty ratio is decided so as not depart from required specifications of the load (server 124) on the basis of an output current Io1 and the duty ratio at that point in time. Hereinafter, a method of forcibly changing the pulse width of the gate voltage Vg1 for only one pulse will be described.

The current detecting unit 120 in FIG. 1 and FIG. 7 detects the output current Io1 of the electrolytic capacitor 119. The low-pass filter 1107 outputs the output current Io1 detected by the current detecting unit 120 after attenuating a frequency component thereof higher than a cut-off frequency. The gain unit 1108 outputs a current obtained by multiplying the output current of the low-pass filter 1107 by the gain k1. The analog-digital converter 1109 converts the output current of the gain unit 1108 from analog to digital, and outputs a digital output current to the microcomputer 1100.

The reduction ratio calculating unit 1112 calculates a reduction ratio β of the duty ratio of the gate voltage Vg1 on the basis of the digital output current outputted from the analog-digital converter 1109 and the duty ratio outputted from the compensator 1111. The duty ratio changing unit 1114 reduces the duty ratio of only one pulse on the basis of the reduction ratio β with respect to the duty ratio outputted from the compensator 1111. The PWM unit 1115 outputs, as illustrated in FIG. 11B, the gate voltage Vg1 reduced in the duty ratio of only one pulse on the basis of the duty ratio outputted from the duty ratio changing unit 1114.

FIG. 12A is a chart illustrating voltages 1201 to 1203 corresponding to the duty ratio outputted from the duty ratio changing unit 1114. The voltage 1201 is a voltage when the output current Io1 is 10 A. The voltage 1202 is a voltage when the output current Io1 is 20 A. The voltage 1203 is a voltage when the output current Io1 is 30 A. To reduce the duty ratio, the duty ratio changing unit 1114 decreases the voltages 1201 to 1203 corresponding to the duty ratio only in a period 1204.

FIG. 12B is a chart illustrating waveforms of output voltages 1211 to 1213 of the electrolytic capacitor 119. The output voltage 1211 is the output voltage Vo1 when the output current Io1 is 10 A. The output voltage 1212 is the output voltage Vo1 when the output current Io1 is 20 A. The output voltage 1213 is the output voltage Vo1 when the output current Io1 is 30 A. When the voltages 1201 to 1203 corresponding to the duty ratio illustrated in FIG. 12A are decreased, the output voltages 1211 to 1213 illustrated in FIG. 12B are also decreased. Thus, the output voltages 1211 to 1213 fluctuate as in the case of the rapid load fluctuation.

FIG. 12C is a chart illustrating waveforms of voltages 1221 to 1223 outputted from the low-pass filter 1101. The voltage 1221 is the output voltage of the low-pass filter 1101 when the output current Id1 is 10 A. The output voltage 1222 is the output voltage of the low-pass filter 1101 when the output current Io1 is 20 A. The output voltage 1223 is the output voltage of the low-pass filter 1101 when the output current Io1 is 30 A. When the voltages 1201 to 1203 corresponding to the duty ratio illustrated in FIG. 12A are decreased, the voltages 1221 to 1223 illustrated in FIG. 12C are also decreased.

Note that the number of pulses reduced in duty ratio is not limited to one, but the duty ratio of a plurality of successive pulses may be reduced. Besides, instead of reducing the duty ratio, the duty ratio may be enlarged.

In the power supply circuit 100, when the duty ratio is multiplied by β only in n cycles, the output power is decreased from an output power P1 to an output power P2. A power fluctuation ΔP is expressed by the following expression (1).

$$\Delta P = P1 - P2 = n \times (1-\beta) \times P1 \qquad (1)$$

FIG. 12A to FIG. 12C illustrate the case where n=1 and β=¼. When n is small, the compensator 1111 does not respond, and therefore current corresponding to shortage is derived from the electrolytic capacitor 119. Besides, a voltage fluctuation ΔV in the output voltage Vo1 is expressed by the following expression (2) when subjected to primary approximation on the bases of a capacitance value C of the electrolytic capacitor 119, a resistance value R of an ESR 1315 in FIG. 13B, the output voltage Vo1, and a cycle T1 of the gate voltage Vg1.

$$\Delta V = Vo1 - \sqrt{[Vo1^2 - \{(2/C) \times (1-\beta) \times P1 \times n \times T1\}] + R \times (1-\beta) \times P1/Vo1} \quad (2)$$

Deciding the number of pulses n and the reduction ratio β so that the voltage fluctuation ΔV falls within the standard of the power supply circuit 100, makes it possible to predict the residual life of the electrolytic capacitor 119 without affecting the load (server 124).

FIG. 13A is a diagram illustrating a configuration example of the electrolytic capacitor 119. The electrolytic capacitor 119 has anode foil 1301, a dielectric ($Al_2O_3$) 1302, an electrolytic solution 1303, electrolytic paper 1304, and cathode foil 1305.

FIG. 13B is a diagram illustrating an equalizing circuit of the electrolytic capacitor 119. The electrolytic capacitor 119 has an inductor 1311, a diode 1312, a capacitor 1313, a resistor 1314, a resistor 1315, a diode 1316, a capacitor 1317, a resistor 1318, and an inductor 1319. The resistor 1315 is an equivalent series resistor (ESR).

FIG. 13C is a chart for explaining a method of deciding the reduction ratio β, and indicates the relationship of the voltage fluctuation ΔV to the resistance value of the ESR 1315 when the output current Io1 is 10 A, 20 A, 30 A, and 40 A. For example, the power supply circuit 100 is required to satisfy a specification that the absolute value of the voltage fluctuation ΔV is 600 mV or less and a specification that the resistance value of the ESR 1315 is 20 mΩ or less. It is necessary to decide the reduction ratio β to satisfy the specifications. For example, when the output current Iot at steady time is 20 A, it is only necessary to decide the reduction ratio β to a value of ¼ or more. In this case, the duty ratio changing unit 1114 changes the duty ratio, for example, from 40% to 10%. This makes it possible to predict the residual life of the electrolytic capacitor 119 without affecting the load (server 124). Besides, when the output current Io1 is larger than 20 A, it is only necessary to decide the reduction ratio β to a larger value.

Figure 14B:
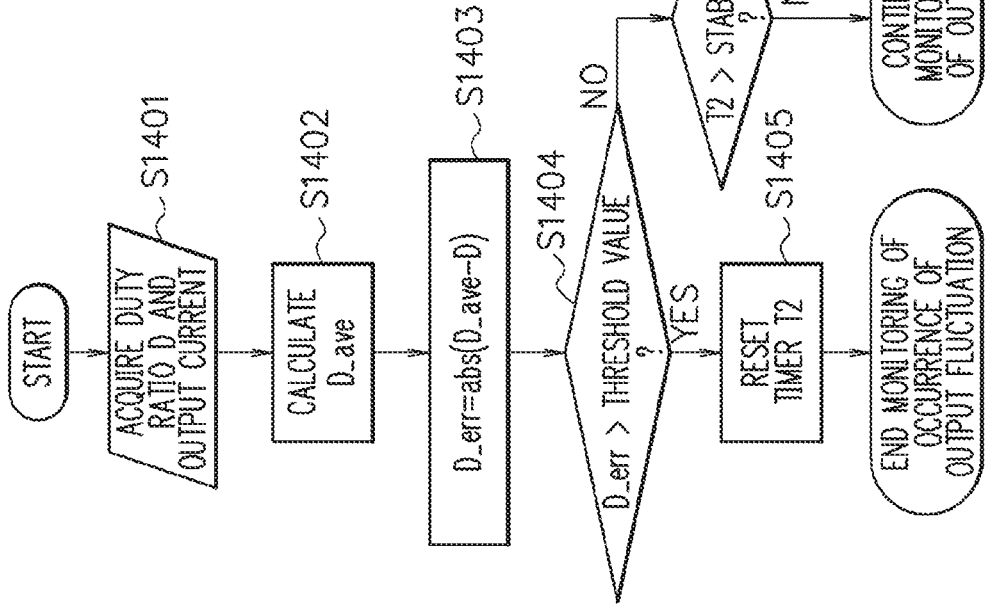
FIG. 14A and FIG. 14B are flowcharts illustrating processing examples of a microcomputer.
Figure 14A:
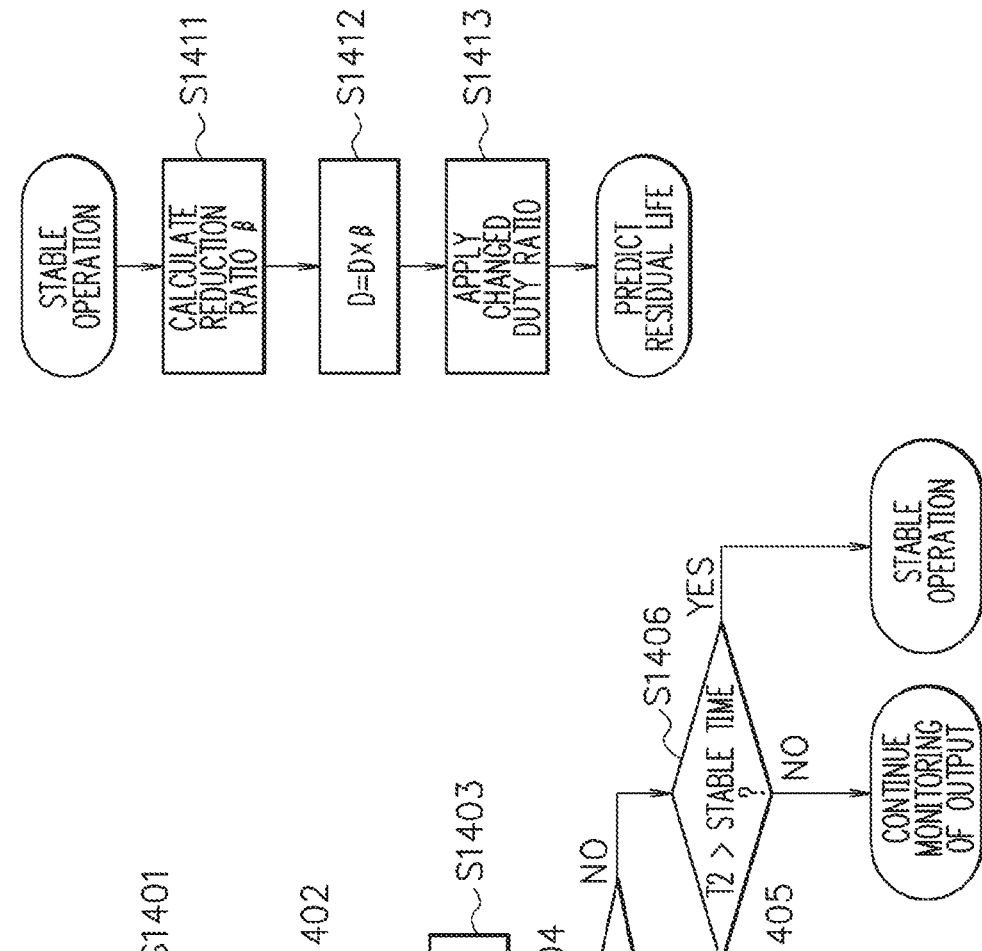

FIG. 14A and FIG. 14B are flowcharts illustrating processing examples of the microcomputer 1100. This processing is performed once at fixed time (for example, one day) intervals. At Step S1401, the reduction ratio calculating unit 1112 acquires a duty ratio D from the compensator 1111 and acquires the digital output current from the analog-digital converter 1109. Next, at Step S1402, the reduction ratio calculating unit 1112 calculates an average duty ratio D_ave until now on the basis of a duty ratio D this time. Next, at Step S1403, the reduction ratio calculating unit 1112 computes an absolute value of a difference between the average duty ratio D_ave and the duty ratio D, as a fluctuation D_err. Next, at Step S1404, the reduction ratio calculating unit 1112 advances the processing to Step S1405 when the fluctuation D_err is larger than a threshold value, and advances the processing to Step S1406 when the fluctuation D_err is equal to or smaller than the threshold value. At Step S1405, the timer 1113 resets a timer value T2 to 0 and starts counting of the timer value T2. Thereafter, the reduction ratio calculating unit 1112 ends the processing without deciding the reduction ratio β because the voltage fluctuation ΔV in the output voltage Vo1 is large. This makes it possible to reduce the duty ratio when the fluctuation in the output voltage Vo1 is large and thereby prevent the absolute value of the voltage fluctuation ΔV in the output voltage Vo1 from exceeding the specification of 600 mV.

At Step S1406, when the timer value T2 is equal to or less than a stable time, the fluctuation in the output voltage Vo1 have not become stable yet, and therefore the reduction ratio calculating unit 1112 returns the processing to Step S1401 and repeats the above-described processing. Besides, when the timer value T2 is more than the stable time, the fluctuation in the output voltage Vo1 is stable, and therefore the reduction ratio calculating unit 1112 advances the processing to Step S1411.

At Step S1411, the reduction ratio calculating unit 1112 calculates the reduction ratio β satisfying the specifications on the basis of the duty ratio D acquired from the compensator 1111 and the digital output current acquired from the analog-digital converter 1109. Next, at Step S1412, the duty ratio changing unit 1114 multiplies the duty ratio D by the reduction ratio β to change the duty ratio of n pulses. Next, at Step S1413, the PWM unit 1115 outputs the gate voltage Vg1 with the reduced duty ratio of n pulses, on the basis of the duty ratio changed by the duty ratio changing unit 1114. This fluctuates the output voltage Vo1, and therefore the control unit 123 predicts the residual life of the electrolytic capacitor 119 as in the first to fourth embodiments.

As described above, the field-effect transistor 112 is a switch for supplying power to the electrolytic capacitor 119. The compensator 1111 is the duty ratio computing unit which computes the duty ratio of the gate voltage (control pulse) Vg1 of the field-effect transistor 112 to make the output voltage Vo1 of the electrolytic capacitor 119 get closer to the target voltage (target value) Vt1. The duty ratio changing unit 1114 and the PWM unit 1115 constitute a pulse generating unit which changes the duty ratio computed by the compensator 1111, for only one pulse or a plurality of pulses, and generates the gate voltage Vg1 of the field-effect transistor 112 on the basis of the changed duty ratio. The fluctuation detecting unit 122c in FIG. 1 detects the maximum value of fluctuation in the output voltage Vo1 of the electrolytic capacitor 119 accompanying the above-described change of the duty ratio. The control unit 123 predicts the residual life of the electrolytic capacitor 119 on the basis of the detection result of the fluctuation detecting unit 122c.

Sixth Embodiment

FIG. 15A is a diagram illustrating a configuration example of a part of the control unit 123 in FIG. 1 and FIG. 7 according to a sixth embodiment. The example in which the control unit 123 controls the gate voltage Vg1 of the field-effect transistor 112 is described in the fifth embodiment, whereas an example in which the control unit 123 controls a date voltage Vg2 of the field-effect transistor 108 will be described in the sixth embodiment. Hereinafter, the points that FIG. 15 is different from FIG. 11A will be described.

The voltage detecting unit 111 in FIG. 1 and FIG. 7 detects an output voltage Vo2 of the electrolytic capacitor 110. The low-pass filter 1101 outputs the output voltage Vo2 detected by the voltage detecting unit 111 after attenuating a frequency component thereof higher than a cut-off frequency. The gain unit 1102 outputs a voltage obtained by multiplying the output voltage of the low-pass filter 1101 by the gain k1. The analog-digital converter 1103 converts the output voltage of the gain unit 1102 from analog to digital, and outputs the digital output voltage Vd1 to the microcomputer 1100.

The target voltage unit 1104 outputs a target voltage Vt2. The target voltage Vt2 is, for example, 400 V. The gain unit 1105 outputs a voltage obtained by multiplying the target voltage Vt2 by the gain k2. The analog-digital converter 1106 converts the output voltage of the gain unit 1105 from analog to digital, and outputs the digital target voltage Vd2 to the microcomputer 1100.

A current detecting unit 125 in FIG. 1 and FIG. 7 detects an output current Io2 of the electrolytic capacitor 110. The low-pass filter 1107 outputs the output current Io2 detected by the current detecting unit 125 after attenuating a frequency component thereof higher than a cut-off frequency. The gain unit 1108 outputs a current obtained by multiplying the output current of the low-pass filter 1107 by the gain k1. The analog-digital converter 1109 converts the output current of the gain unit 1108 from analog to digital, and outputs a digital output current to the microcomputer 1100.

The microcomputer 1100 outputs, as in the fifth embodiment, the gate voltage Vg2 of the field-effect transistor 108 on the basis of the digital output current outputted from the analog-digital converter 1109, the digital output voltage Vd1, and the digital target voltage Vd2. The subtracting unit 1110 subtracts the digital output voltage Vd1 from the digital target voltage Vd2, and outputs a subtraction result. The compensator 1111 computes the duty ratio of the gate voltage Vg2 of the field-effect transistor 108 on the basis of the output value of the subtracting unit 1110. The PWM unit 1115 outputs the gate voltage Vg2 modulated in pulse width on the basis of the duty ratio outputted from the duty ratio changing unit 1114, to the gate of the field-effect transistor 108. Thus, the microcomputer 1100 generates the gate voltage Vg2 to make the output voltage Vo2 get closer to the target voltage Vt2. The duty ratio changing unit 1114 changes the duty ratio of a plurality of successive pulses.

An alternating-current voltage 1501 in FIG. 15B is an alternating-current voltage outputted from the alternating-current power supply 101, and has a cycle of 20 ms. The field-effect transistor 108 in FIG. 1 and FIG. 7 is the power factor improvement circuit that improves the power factor of the alternating-current voltage 1501, and is required to have instantaneous interruption resistance of a half cycle (10 ms) to one cycle (20 ms) of the alternating-current, voltage 1501, and therefore the capacitance of the electrolytic capacitor 110 is very large. Therefore, the fluctuation in the output voltage Vo2 of the electrolytic capacitor 110 cannot be detected only by the control unit 123 reducing the duty ratio of several pulses of the gate voltage Vg2 of the field-effect transistor 108. To fluctuate the output voltage Vo2 of the electrolytic capacitor 110, it is necessary to reduce the duty ratio of the gate voltage Vg2 of the field-effect transistor 108 by the reduction ratio β for a plurality of pulses in a period equal to or more than a threshold value. The reduction ratio calculating unit 1112 outputs, for example, a reduction ratio β=¼ to the duty ratio changing unit 1114. For example, as illustrated in FIG. 15B, the duty ratio changing unit 1114 decreases a voltage 1503 corresponding to the duty ratio in a first period of 5 ms near the peak of the alternating-current voltage 1501. The PWM unit 1115 generates a gate voltage Vg2 having a small pulse width in the first period of 5 ms. Thus, the on-time of the field-effect transistor 108 becomes shorter, and an output voltage 1502 of the electrolytic capacitor 110 fluctuates. The control unit 123 can predict, as in the first to fourth embodiments, the residual lives of the electrolytic capacitors 110 and 119 on the basis of the fluctuation in the output voltage 1502.

As described above, the compensator 1111 is a duty ratio computing unit which computes the duty ratio of the gate voltage (control pulse) Vg2 of the field-effect transistor 108 to make the output voltage Vo2 of the electrolytic capacitor 110 get closer to the target voltage (target value) Vt2. The duty ratio changing unit 1114 and the PWM unit 1115 constitute a pulse generating unit which changes the duty ratio computed by the compensator 1111 only in the first period, and generates the gate voltage Vg2 of the field-effect transistor 108 on the basis of the changed duty ratio. The fluctuation detecting unit 122a in FIG. 1 detects the maximum value of fluctuation in the output voltage Vo2 of the electrolytic capacitor 110 accompanying the change of the duty ratio. The fluctuation detecting unit 122c detects the maximum value of fluctuation in the output voltage Vo1 of the electrolytic capacitor 119 accompanying the change of the duty ratio. The control unit 123 predicts the residual life of the electrolytic capacitor 110 on the basis of the detection result of the fluctuation detecting unit 122a, and predicts the residual life of the electrolytic capacitor 119 on the basis of the detection result of the fluctuation detecting unit 122c.

The microcomputer 1100 in this embodiment can be realized by the computer executing the program. Further, a computer-readable recording medium having the above-described program recorded thereon and a computer program product such as the above-described program are also applicable as embodiments of the present invention. As the recording medium, for example, flexible disk, a hard disk, an optical disk, a magneto-optical disk, a CD-ROM, a magnetic tape, a non-volatile memory card, a ROM or the like can be used.

It should be noted that the above embodiments merely illustrate concrete examples of implementing the present invention, and the technical scope of the present invention is not to be construed in a restrictive manner by these embodiments. That is, the present invention may be implemented in various forms without departing from the technical spirit or main features thereof.

It is possible to report a residual life of a first capacitor by predicting the residual life of the first capacitor and outputting a signal indicating the residual life of the first capacitor.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A capacitor life diagnosis device comprising: a first rectifying circuit that rectifies an alternating-current voltage: a first capacitor to which the voltage rectified by the first rectifying circuit is applied: a transformer comprising a primary winding and a secondary winding, that transforms an output voltage of the first capacitor and outputs the transformed voltage to the secondary winding; a second rectifying circuit that rectifies a voltage of the secondary winding of the transformer; a second capacitor to which the voltage rectified by the second rectifying circuit is applied; a first fluctuation detector that detects a maximum value of fluctuation in output voltage of the first capacitor every fixed time; a second fluctuation detector that detects a maximum value of fluctuation in output voltage of the second capacitor every fixed time; and a controller that receives the maximum value of fluctuation in the output voltage from the first fluctuation detector, predicts a residual life of the first capacitor by using temporal transition of the maximum value of fluctuation in the output voltage, and outputs a signal indicating the residual life of the first capacitor, and receives the maximum value of fluctuation in the output voltage from the second fluctuation detector, predicts a residual life of the second capacitor by using temporal transition of the maximum value of fluctuation in the output voltage, and outputs a signal indicating the residual life of the second capacitor, wherein the first fluctuation detector comprises: a first peak hold unit that detects a maximum value in the fixed time of the output voltage of the first capacitor; a first bottom hold unit that detects a minimum value in the fixed time of the output voltage of the first capacitor; and a first difference unit that outputs a difference between the maximum value detected by the first peak hold unit and the minimum value detected by the first bottom hold unit, and wherein the second fluctuation detector comprises: a second peak hold unit that detects a maximum value in the fixed time of the output voltage of the second capacitor; a second bottom hold unit that detects a minimum value in the fixed time of the output voltage of the second capacitor; and a second difference unit that outputs a difference between the maximum value detected by the second peak hold unit and the minimum value detected by the second bottom hold unit.

2. The capacitor life diagnosis device according to claim 1, further comprising:
a third fluctuation detector that detects a maximum value of fluctuation in output current of the second capacitor every fixed time,
wherein the controller predicts the residual life of the second capacitor on the basis of the temporal transition of the maximum value of fluctuation in the output voltage detected by the second fluctuation detector when the maximum value of fluctuation in the output current detected by the third fluctuation detector is larger than a threshold value, and outputs a signal indicating the residual life of the second capacitor.

3. The capacitor life diagnosis device according to claim 1,
wherein the first capacitor and the second capacitor are electrolytic capacitors.

4. The capacitor life diagnosis device according to claim 1, further comprising: a switch that supplies power to the second capacitor; a duty ratio computing unit that computes a duty ratio of a control pulse of the switch to make the output voltage of the second capacitor get closer to a target value; and a pulse generating unit that changes the computed duty ratio of only one pulse or a plurality of pulses, and generate the control pulse of the switch on the basis of the changed duty ratio, wherein the second fluctuation detector detects a maximum value of fluctuation in the output voltage of the second capacitor accompanying the change of the duty ratio.

5. The capacitor life diagnosis device according to claim 1, further comprising:
a server to which a power supply voltage is supplied from the second capacitor,
wherein the server allocates a virtual machine according to the signal indicating the residual life of the second capacitor.

6. The capacitor life diagnosis device according to claim 1, further comprising:
a first transistor connected between the first rectifying circuit and the primary winding of the transformer.

7. The capacitor life diagnosis device according to claim 6, further comprising: a duty ratio computing unit that computes a duty ratio of a control pulse of the first transistor to make the output voltage of the second capacitor get closer to a target value; and a pulse generating unit that changes the computed duty ratio of only one pulse or a plurality of pulses, and generate the control pulse of the first transistor on the basis of the changed duty ratio, wherein the second fluctuation detector detects a maximum value of fluctuation in the output voltage of the fast-second capacitor accompanying the change of the duty ratio.

8. The capacitor life diagnosis device according to claim 1, further comprising:
a second transistor having a source connected to a ground potential node;
an inductor connected between the first rectifying circuit and a drain of the second transistor; and
a diode having an anode connected to the drain of the second transistor and a cathode connected to the first capacitor.

9. The capacitor life diagnosis device according to claim 8, further comprising: a duty ratio computing unit that computes a duty ratio of a control pulse of the second transistor to make the output voltage of the first capacitor get closer to a target value; and a pulse generating unit that changes the computed duty ratio in only one period, and generate the control pulse of the second transistor on the basis of the changed duty ratio, and wherein the first fluctuation detector detects a maximum value of fluctuation in the output voltage of the first capacitor accompanying the change of the duty ratio.

10. The capacitor life diagnosis device according to claim 8, further comprising: a duty ratio computing unit that computes a duty ratio of a control pulse of the second transistor to make the output voltage of the first capacitor get closer to a target value; and a pulse generating unit that changes the computed duty ratio in only one period, and generate the control pulse of the second transistor on the basis of the changed duty ratio, and wherein the second fluctuation detector detects a maximum value of fluctuation in the output voltage of the second capacitor accompanying the change of the duty ratio.

11. The capacitor life diagnosis device according to claim 1,
wherein the second fluctuation detector detects a maximum value of fluctuation in the output voltage of the second capacitor accompanying load fluctuation of the second capacitor every fixed time.

12. The capacitor life diagnosis device according to claim 11,
wherein the second capacitor outputs voltage to a load,
wherein the capacitor life diagnosis device further comprises a power supply circuit that outputs voltage to the load, and
wherein the power supply circuit fluctuates the output voltage to fluctuate the load.

* * * * *